US012266963B2

(12) United States Patent
Mendes et al.

(10) Patent No.: US 12,266,963 B2
(45) Date of Patent: *Apr. 1, 2025

(54) SYSTEMS FOR ANALYSIS OF VEHICLE BATTERY HEALTH

(71) Applicant: Geotab Inc., Oakville (CA)

(72) Inventors: Christopher Joseph Mendes, Kitchener (CA); Michael Prem Mehta, Toronto (CA)

(73) Assignee: Geotab Inc., Oakville (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/219,817

(22) Filed: Jul. 10, 2023

(65) Prior Publication Data

US 2023/0352956 A1    Nov. 2, 2023

Related U.S. Application Data

(63) Continuation of application No. 17/673,427, filed on Feb. 16, 2022, now Pat. No. 11,742,681.
(Continued)

(51) Int. Cl.
*G01R 31/392* (2019.01)
*B60L 58/12* (2019.01)
(Continued)

(52) U.S. Cl.
CPC .............. *H02J 7/005* (2020.01); *B60L 58/12* (2019.02); *B60L 58/16* (2019.02); *G01R 31/392* (2019.01);
(Continued)

(58) Field of Classification Search
None
See application file for complete search history.

(56) References Cited

U.S. PATENT DOCUMENTS 5,691,078 A * 11/1997 Kozaki ............... G04C 10/04
324/428
7,257,396 B2    8/2007 Olsen
(Continued)

FOREIGN PATENT DOCUMENTS

CA    2842024 A1    3/2013
CA    3101535 C     9/2022
(Continued)

OTHER PUBLICATIONS

Extended European Search Report dated Feb. 1, 2023 for Application No. 22184048.1.

*Primary Examiner* — Jas A Sanghera
(74) *Attorney, Agent, or Firm* — Mark J. Pringle-Rigby

(57) ABSTRACT

The present disclosure relates to systems, devices, and methods for analyzing health of vehicle batteries. Vehicle batteries tend to degrade over time. The described systems, devices, and methods quantify this degradation (or quantify remaining health of the battery) by comparing average energy used to charge or discharge the battery by a charge level unit to a nominal quantity of energy used to charge or discharge a battery in optimal health by a charge level unit. Charge data for previous charge events of the vehicle battery can be used in the calculation, and can be filtered by identifying qualified charge events based on at least one of a number of metrics. Usage data for previous usage events of the vehicle battery can be used in the calculation, and can be filtered by identifying qualified usage events or subgroups of usage event based on at least one of a number of metrics.

19 Claims, 5 Drawing Sheets

Related U.S. Application Data

(60) Provisional application No. 63/220,653, filed on Jul. 12, 2021.

(51) Int. Cl.
B60L 58/16 (2019.01)
H02J 7/00 (2006.01)

(52) U.S. Cl.
CPC ........ H02J 7/00036 (2020.01); H02J 7/0048 (2020.01)

(56) References Cited

U.S. PATENT DOCUMENTS

| | | | |
|---|---|---|---|
| 7,683,774 | B2 | 3/2010 | Olsen |
| 8,509,987 | B2 | 8/2013 | Resner |
| 9,002,645 | B2 | 4/2015 | Davidson |
| 9,342,933 | B2 | 5/2016 | Olsen, III |
| 9,678,164 | B2 | 6/2017 | Mitsuyama |
| 9,754,426 | B2 | 9/2017 | Meyer |
| 9,886,800 | B2 | 2/2018 | Grob |
| 10,192,370 | B2 | 1/2019 | Davidson |
| 10,197,631 | B2 | 2/2019 | Barfield, Jr. et al. |
| 10,240,944 | B2 | 3/2019 | Santilli |
| 10,719,997 | B1 | 7/2020 | Aiello |
| 11,378,625 | B2 | 7/2022 | Alleva et al. |
| 11,653,127 | B2 | 5/2023 | Meißner et al. |
| 11,654,791 | B2 * | 5/2023 | Mehta ................ H02J 7/00032 324/426 |
| 2004/0189257 | A1 | 9/2004 | Dougherty |
| 2005/0040789 | A1 | 2/2005 | Salasoo |
| 2009/0326841 | A1 | 12/2009 | Zhang et al. |
| 2011/0082621 | A1 | 4/2011 | Berkobin et al. |
| 2013/0278221 | A1 | 10/2013 | Maeda |
| 2014/0159736 | A1 | 6/2014 | Morimoto |
| 2015/0321572 | A1 | 11/2015 | Koch |
| 2016/0178706 | A1 | 6/2016 | Liu |
| 2016/0187432 | A1 | 6/2016 | Saint-Marcoux |
| 2016/0334227 | A1 | 11/2016 | Davidson |
| 2017/0108552 | A1 | 4/2017 | Roumi et al. |
| 2017/0244270 | A1 * | 8/2017 | Waters .................... H02J 50/80 |
| 2018/0182182 | A1 | 6/2018 | Meyer |
| 2019/0011279 | A1 | 1/2019 | Davidson |
| 2019/0025379 | A1 | 1/2019 | Pajovic et al. |
| 2019/0122322 | A1 | 4/2019 | Perez |
| 2019/0156597 | A1 | 5/2019 | Santoro |
| 2019/0294173 | A1 * | 9/2019 | Szubbocsev ......... G05D 1/0274 |
| 2019/0324092 | A1 | 10/2019 | Sabina |
| 2019/0363551 | A1 | 11/2019 | Patey |
| 2020/0269719 | A1 | 8/2020 | Aykol |
| 2020/0294333 | A1 | 9/2020 | Aiello |
| 2021/0148989 | A1 | 5/2021 | Malloy |
| 2021/0190880 | A1 | 6/2021 | Hascoat |
| 2021/0255247 | A1 | 8/2021 | Alleva |
| 2021/0394744 | A1 | 12/2021 | Yamashita |
| 2022/0001765 | A1 | 1/2022 | Schubert |
| 2022/0026492 | A1 | 1/2022 | Verheijen |
| 2022/0043066 | A1 | 2/2022 | Lloyd et al. |
| 2022/0399580 | A1 * | 12/2022 | K.V. ........................ H02J 7/345 |
| 2023/0007834 | A1 | 1/2023 | Mehta |
| 2023/0010181 | A1 | 1/2023 | Mehta |
| 2023/0012296 | A1 | 1/2023 | Mehta |

FOREIGN PATENT DOCUMENTS

| | | |
|---|---|---|
| CN | 111251940 A | 6/2020 |
| DE | 19541959 C2 | 3/2001 |
| EP | 1396729 B1 | 12/2012 |
| EP | 3085568 A1 | 10/2016 |
| EP | 3085568 B1 | 7/2020 |
| EP | 3417302 B1 | 12/2020 |
| FR | 3029296 A1 | 6/2016 |
| JP | 2018055783 A | 4/2018 |
| WO | 2018001800 A1 | 1/2018 |
| WO | 2020003070 A1 | 1/2020 |
| WO | 2020120514 A1 | 6/2020 |

* cited by examiner

SYSTEMS FOR ANALYSIS OF VEHICLE BATTERY HEALTH

PRIOR APPLICATION DATA

The present application is a continuation of U.S. Non-Provisional patent application Ser. No. 17/673,427, filed Feb. 16, 2022, titled "METHODS FOR ANALYSIS OF VEHICLE BATTERY HEALTH", which claims priority to U.S. Provisional Patent Application No. 63/220,653, filed Jul. 12, 2021, titled "SYSTEMS, DEVICES, AND METHODS FOR ANALYSIS OF VEHICLE BATTERY HEALTH", the entirety of which is incorporated herein by reference.

TECHNICAL FIELD

The present disclosure generally relates to systems, devices, and methods for analyzing health of vehicle batteries, and in particular relates to analyzing battery health based on energy data such as charge data and usage data.

BACKGROUND

Electric vehicles (such as hybrid electric vehicles or all-electric vehicles) typically have at least one vehicle battery which provides electrical power to fuel the vehicle. Such batteries tend to degrade with time and use, and become less able to store charge or output less power when compared to a new battery. It is desirable to be able to determine or estimate health of a vehicle battery, for example to better predict a vehicle's capabilities (e.g. range), or to plan maintenance.

SUMMARY

According to a broad aspect, the present disclosure describes a method of evaluating vehicle battery health, comprising: receiving charge data for a plurality of charge events of a vehicle battery, wherein an energy capacity of the vehicle battery is represented by a total number of charge level units, and a charge level of the vehicle battery is represented by a proportion of the charge level units corresponding to a proportion of energy stored by the vehicle battery to energy capacity of the vehicle battery; calculating an average energy to charge the vehicle battery by one charge level unit, where calculating the average energy is based on charge data for at least a subset of the plurality of charge events; and determining health of the vehicle battery as a function of a difference between the average energy to charge the vehicle battery by one charge level unit to a nominal energy to charge the vehicle battery by one charge level unit.

The method may further comprise determining whether charge events in the plurality of charge events are qualified charge events, and the subset of the plurality of charge events may include only qualified charge events.

Determining whether charge events are qualified charge events may comprise, for each charge event for which qualification of the charge event is determined, identifying the charge event as a qualified charge event if at least one metric is satisfied, the at least one metric selected from a group consisting of: an amount of energy transferred to the vehicle battery in the charge event exceeds a select proportion of the energy capacity of the vehicle battery; charge level of the vehicle battery exceeds a threshold of the energy capacity of the vehicle battery at an end of the charge event; a rate of energy transfer to the vehicle battery during the charge event exceeds an energy transfer rate threshold; and a duration of the charge event is within a time threshold.

Determining whether charge events are qualified charge events may comprise, for each charge event for which qualification of the charge event is determined, identifying the charge event as a qualified charge event if an amount of energy transferred to the vehicle battery during the charge event exceeds 20% of the energy capacity of the vehicle battery.

Determining whether charge events are qualified charge events may comprise, for each charge event for which qualification of the charge event is determined, identifying the charge event as a qualified charge event if charge level of the vehicle battery exceeds 79% of the energy capacity of the vehicle battery at an end of the charge event.

Determining whether charge events are qualified charge events may comprise, for each charge event for which qualification of the charge event is determined, identifying the charge event as a qualified charge event if a rate of energy transfer to the vehicle battery in the charge event exceeds 0.6 kW.

Determining whether charge events are qualified charge events may comprise, for each charge event for which qualification of the charge event is determined, identifying the charge event as a qualified charge event if a duration of the charge event is 24 hours or less.

Determining whether charge events are qualified charge events may comprise, for each charge event for which qualification of the charge event is determined, identifying the charge event as a qualified charge event if: an amount of energy transferred to the vehicle battery in the charge event exceeds a select proportion of the energy capacity of the vehicle battery; charge level of the vehicle battery exceeds a threshold of the energy capacity of the vehicle battery at an end of the charge event; a rate of energy transfer to the vehicle battery during the charge event exceeds an energy transfer rate threshold; and a duration of the charge event is within a time threshold.

The subset of the plurality of charge events represented in the charge data may include only six most recent qualified charge events. The subset of the plurality of charge events represented in the charge data may include only ten most recent qualified charge events.

Determining health of the vehicle battery may comprise: determining a difference between the nominal energy to charge the vehicle battery by one charge level unit and the average energy to charge the vehicle battery by one charge level unit; determining a numerical representation of degradation of vehicle battery health by dividing the determined difference by the nominal energy to charge the vehicle battery by one charge level unit; and subtracting the numerical representation of degradation of vehicle battery health from a numerical representation of optimal vehicle battery health.

The method may further comprise determining the nominal energy to charge the vehicle battery by one charge level unit by dividing an optimal value for energy capacity of the vehicle battery by the total number of charge level units. The method may further comprise determining the optimal value for energy capacity of the vehicle battery by: receiving energy capacity data for a plurality of vehicle batteries which satisfy newness criteria; determining a first statistical optimal energy capacity of at least a first subset of the plurality of vehicle batteries which satisfy the newness criteria; and identifying the optimal value for energy capacity of the vehicle battery as the first statistical optimal energy capacity. The method may further comprise: identifying at least one other subset of the plurality of vehicle batteries which satisfy the newness criteria, the at least one other subset of the plurality of vehicle batteries being different from the first subset of the plurality of vehicle batteries; and determining a statistical optimal energy capacity of each subset of the at least one other subset of the plurality of vehicle batteries which satisfy the newness criteria, wherein determining the optimal value for energy capacity of the vehicle battery as the first statistical optimal energy capacity may comprise: identifying the first statistical optimal energy capacity as being closer to an expected optimal energy capacity than the respective statistical optimal energy capacity for each subset of the at least one other subset.

The newness criteria for each vehicle battery of the plurality of vehicle batteries may be at least one criteria selected from a group of criteria consisting of: age of the respective vehicle battery being within a time threshold of a manufacture date of the vehicle battery; age of the respective vehicle battery being within a time threshold of a manufacture date of a vehicle in which the vehicle battery is included; age of the respective vehicle battery being within a time threshold of a release date of a vehicle model for a vehicle in which the vehicle battery is included; and total distance driven by a vehicle in which the respective vehicle battery is included is less than a distance threshold. The newness criteria for each vehicle battery of the plurality of vehicle batteries may comprise: total distance driven by a vehicle in which the respective vehicle battery is included is less than 25,000 kilometers; and age of the respective vehicle battery being within a one year of a release date of a vehicle model for the vehicle in which the respective vehicle battery is included.

Determining a first statistical optimal energy capacity of at least a first subset of the plurality of vehicle batteries which satisfy the newness criteria may comprise: determining a sample mean energy capacity of at least the first subset of the plurality of vehicle batteries. Determining a first statistical optimal energy capacity of at least a first subset of the plurality of vehicle batteries which satisfy the newness criteria may comprise: determining a sample median energy capacity of at least the first subset of the plurality of vehicle batteries. Determining a first statistical optimal energy capacity of at least a first subset of the plurality of vehicle batteries which satisfy the newness criteria may comprise: determining an energy capacity of a peak probability for a Gaussian distribution of at least the first subset of the plurality of vehicle batteries.

Receiving charge data for a plurality of charge events may comprise monitoring, by at least one sensor, energy transferred to the vehicle battery.

According to another broad aspect, the present disclosure describes a system comprising: at least one processor; at least one non-transitory processor-readable storage medium having instructions stored thereon, which when executed cause the at least one processor to: process charge data for a plurality of charge events of a vehicle battery, wherein an energy capacity of the vehicle battery is represented by a total number of charge level units, and a charge level of the vehicle battery is represented by a proportion of the charge level units corresponding to a proportion of energy stored by the vehicle battery to the energy capacity of the vehicle battery; calculate an average energy to charge the vehicle battery by one charge level unit, where calculating the average energy is based on charge data for at least a subset of the plurality of charge events; and determine health of the vehicle battery as a function of a difference between the average energy to charge the vehicle battery by one charge level unit to a nominal energy to charge the vehicle battery by one charge level unit.

The instructions may further cause the at least one processor to determine whether charge events in the plurality of charge events are qualified charge events, and the subset of the plurality of charge events may include only qualified charge events.

The instructions which cause the at least one processor to determine whether charge events are qualified charge events may cause the at least one processor to, for each charge event for which qualification of the charge event is determined, identify the charge event as a qualified charge event if at least one metric is satisfied, the at least one metric selected from a group consisting of: an amount of energy transferred to the vehicle battery in the charge event exceeds a select proportion of the energy capacity of the vehicle battery; charge level of the vehicle battery exceeds a threshold of the energy capacity of the vehicle battery at an end of the charge event; a rate of energy transfer to the vehicle battery during the charge event exceeds an energy transfer rate threshold; and a duration of the charge event is within a time threshold.

The instructions which cause the at least one processor to determine whether charge events are qualified charge events may cause the at least one processor to, for each charge event for which qualification of the charge event is determined, identify the charge event as a qualified charge event if an amount of energy transferred to the vehicle battery during the charge event exceeds 20% of the energy capacity of the vehicle battery.

The instructions which cause the at least one processor to determine whether charge events are qualified charge events may cause the at least one processor to, for each charge event for which qualification of the charge event is determined, identify the charge event as a qualified charge event if charge level of the vehicle battery exceeds 79% of the energy capacity of the vehicle battery at an end of the charge event.

The instructions which cause the at least one processor to determine whether charge events are qualified charge events may cause the at least one processor to, for each charge event for which qualification of the charge event is determined, identify the charge event as a qualified charge event if a rate of energy transfer to the vehicle battery in the charge event exceeds 0.6 kW.

The instructions which cause the at least one processor to determine whether charge events are qualified charge events may cause the at least one processor to, for each charge event for which qualification of the charge event is determined, identify the charge event as a qualified charge event if a duration of the charge event is 24 hours or less.

The instructions which cause the at least one processor to determine whether charge events are qualified charge events may cause the at least one processor to, for each charge event for which qualification of the charge event is determined, identify the charge event as a qualified charge event if: an amount of energy transferred to the vehicle battery in the charge event exceeds a select proportion of the energy capacity of the vehicle battery; charge level of the vehicle battery exceeds a threshold of the energy capacity of the vehicle battery at an end of the charge event; a rate of energy transfer to the vehicle battery during the charge event exceeds an energy transfer rate threshold; and a duration of the charge event is within a time threshold.

The subset of the plurality of charge events represented in the charge data may include only six most recent qualified charge events. The subset of the plurality of charge events represented in the charge data may include only ten most recent qualified charge events.

The instructions which cause the at least one processor to determine health of the vehicle battery may cause the at least one processor to: determine a difference between the nominal energy to charge the vehicle battery by one charge level unit and the average energy to charge the vehicle battery by one charge level unit; determine a numerical representation of degradation of vehicle battery health by dividing the determined difference by the nominal energy to charge the vehicle battery by one charge level unit; and subtract the numerical representation of degradation of vehicle battery health from a numerical representation of optimal vehicle battery health.

The instructions may further cause the at least one processor to determine the nominal energy to charge the vehicle battery by one charge level unit by dividing an optimal value for energy capacity of the vehicle battery by the total number of charge level units.

The system may further comprise the vehicle battery. The at least one processor, the at least one non-transitory processor-readable storage medium, and the vehicle battery may be included in a vehicle.

The system may further comprise a power source operable to transfer energy to the vehicle battery during charge events. The at least one processor, the at least one non-transitory processor-readable storage medium, and the power source may be included in a charging station electrically couplable to the vehicle battery. The at least one processor and the at least one non-transitory processor-readable storage medium may be included in a computing device remote from the vehicle battery and the power source.

The at least one processor and the at least one non-transitory processor-readable storage medium may be included in an intermediate device electrically couplable to the vehicle battery and to a power source operable to transfer energy to the vehicle battery during charge events.

The system may further comprise at least one sensor operable to monitor energy transferred to the vehicle battery and provide the charge data based on the monitored energy transfer.

According to yet another broad aspect, the present disclosure describes a device electrically couplable to a vehicle battery, the device comprising: at least one processor; at least one non-transitory processor-readable storage medium having instructions stored thereon, which when executed cause the at least one processor to: process charge data for a plurality of charge events of the vehicle battery, wherein an energy capacity of the vehicle battery is represented by a total number of charge level units, and a charge level of the vehicle battery is represented by a proportion of the charge level units corresponding to a proportion of energy stored by the vehicle battery to the energy capacity of the vehicle battery; calculate an average energy to charge the vehicle battery by one charge level unit, where calculating the average energy is based on charge data for at least a subset of the plurality of charge events; and determine health of the vehicle battery as a function of a difference between the average energy to charge the vehicle battery by one charge level unit to a nominal energy to charge the vehicle battery by one charge level unit.

The instructions may further cause the at least one processor to determine whether charge events in the plurality of charge events are qualified charge events, and the subset of the plurality of charge events may include only qualified charge events.

The instructions which cause the at least one processor to determine whether charge events are qualified charge events may cause the at least one processor to, for each charge event for which qualification of the charge event is determined, identify the charge event as a qualified charge event if at least one metric is satisfied, the at least one metric selected from a group consisting of: an amount of energy transferred to the vehicle battery in the charge event exceeds a select proportion of the energy capacity of the vehicle battery; charge level of the vehicle battery exceeds a threshold of the energy capacity of the vehicle battery at an end of the charge event; a rate of energy transfer to the vehicle battery during the charge event exceeds an energy transfer rate threshold; and a duration of the charge event is within a time threshold.

The instructions which cause the at least one processor to determine whether charge events are qualified charge events may cause the at least one processor to, for each charge event for which qualification of the charge event is determined, identify the charge event as a qualified charge event if an amount of energy transferred to the vehicle battery during the charge event exceeds 20% of the energy capacity of the vehicle battery.

The instructions which cause the at least one processor to determine whether charge events are qualified charge events may cause the at least one processor to, for each charge event for which qualification of the charge event is determined, identify the charge event as a qualified charge event if charge level of the vehicle battery exceeds 79% of the energy capacity of the vehicle battery at an end of the charge event.

The instructions which cause the at least one processor to determine whether charge events are qualified charge events may cause the at least one processor to, for each charge event for which qualification of the charge event is determined, identify the charge event as a qualified charge event if a rate of energy transfer to the vehicle battery in the charge event exceeds 0.6 kW.

The instructions which cause the at least one processor to determine whether charge events are qualified charge events may cause the at least one processor to, for each charge event for which qualification of the charge event is determined, identify the charge event as a qualified charge event if a duration of the charge event is 24 hours or less.

The instructions which cause the at least one processor to determine whether charge events are qualified charge events may cause the at least one processor to, for each charge event for which qualification of the charge event is determined, identify the charge event as a qualified charge event if: an amount of energy transferred to the vehicle battery in the charge event exceeds a select proportion of the energy capacity of the vehicle battery; charge level of the vehicle battery exceeds a threshold of the energy capacity of the vehicle battery at an end of the charge event; a rate of energy transfer to the vehicle battery during the charge event exceeds an energy transfer rate threshold; and a duration of the charge event is within a time threshold.

The subset of the plurality of charge events represented in the charge data may include only six most recent qualified charge events. The subset of the plurality of charge events represented in the charge data may include only ten most recent qualified charge events.

The instructions which cause the at least one processor to determine health of the vehicle battery may cause the at least one processor to: determine a difference between the nominal energy to charge the vehicle battery by one charge level unit and the average energy to charge the vehicle battery by one charge level unit; determine a numerical representation of degradation of vehicle battery health by dividing the determined difference by the nominal energy to charge the vehicle battery by one charge level unit; and subtract the numerical representation of degradation of vehicle battery health from a numerical representation of optimal vehicle battery health.

The instructions may further cause the at least one processor to determine the nominal energy to charge the vehicle battery by one charge level unit by dividing an optimal value for energy capacity of the vehicle battery by the total number of charge level units.

The device may be electrically couplable to the vehicle battery and to a power source operable to transfer energy to the vehicle battery via the device during charge events.

The device may further comprise at least one sensor operable to monitor energy transferred to the vehicle battery and provide the charge data based on the monitored energy transfer.

According to yet another broad aspect, the present disclosure describes a method of evaluating vehicle battery health, comprising: receiving usage data for a plurality of usage events of a vehicle battery, wherein an energy capacity of the vehicle battery is represented by a total number of charge level units, and a charge level of the vehicle battery is represented by a proportion of the charge level units corresponding to a proportion of energy stored by the vehicle battery to energy capacity of the vehicle battery; calculating an average energy to discharge the vehicle battery by one charge level unit, where calculating the average energy is based on usage data for at least a subset of the plurality of usage events; and determining health of the vehicle battery as a function of a difference between the average energy to discharge the vehicle battery by one charge level unit to a nominal energy to discharge the vehicle battery by one charge level unit.

The method may further comprise: identifying at least one subgroup of usage events of the plurality of usage events; and qualifying at least one subgroup of the at least one subgroup of usage events, wherein the subset of the plurality of usage events includes only subgroups of usage events which have been qualified.

Identifying at least one subgroup of usage events may comprise: identifying each subgroup of usage events as a respective group of usage events between sequential charge events of the vehicle battery. Identifying at least one subgroup of usage events may comprise: identifying each subgroup of usage events as a respective group of usage events within a respective time period. Identifying at least one subgroup of usage events may comprise: identifying each subgroup of usage events as a respective group of a set number of sequential usage events.

Qualifying at least one subgroup may comprise: for each subgroup of the at least one subgroup of usage events, qualify the subgroup if at least one metric is satisfied, the at least one metric selected from a group of metrics consisting of: a net amount of energy discharged from the vehicle battery over all of the usage events in the subgroup exceeds a select proportion of the energy capacity of the vehicle battery; charge level of the vehicle battery exceeds a threshold of the energy capacity of the vehicle battery at a start of at least one usage event in the subgroup; and each usage event in the subgroup is within a select time threshold. Qualifying at least one subgroup may comprise: for each subgroup of the at least one subgroup of usage events, qualify the subgroup if: a net amount of energy discharged from the vehicle battery over all of the usage events in the subgroup exceeds a select proportion of the energy capacity of the vehicle battery; charge level of the vehicle battery exceeds a threshold of the energy capacity of the vehicle battery at a start of at least one usage event in the subgroup; and each usage event in the subgroup is within a select time threshold. Qualifying at least one subgroup may comprise: for each subgroup of the at least one subgroup of usage events, qualify the subgroup if a net amount of energy discharged from the vehicle battery over all of the usage events in the subgroup exceeds 20% of the energy capacity of the vehicle battery.

The subset of the plurality of usage events may include at least one subgroup of usage events, where a net amount of energy discharged from the vehicle battery over all of the usage events in a subgroup of the at least one subgroup of usage events exceeds a select proportion of the energy capacity of the vehicle battery; and the method may further comprise: where a net amount of energy discharged from the vehicle battery over a first usage event is less than the select proportion of the energy capacity of the vehicle battery, grouping the first usage event with at least one sequential usage event as a subgroup of usage events in the at least one subgroup of usage events.

The subset of the plurality of usage events represented in the usage data may include only six most recent qualified subgroups of usage events.

Determining health of the vehicle battery may comprise: determining a difference between the nominal energy to discharge the vehicle battery by one charge level unit and the average energy to discharge the vehicle battery by one charge level unit; determining a numerical representation of degradation of vehicle battery health by dividing the determined difference by the nominal energy to discharge the vehicle battery by one charge level unit; and subtracting the numerical representation of degradation of vehicle battery health from a numerical representation of optimal vehicle battery health.

The method may further comprise determining the nominal energy to discharge the vehicle battery by one charge level unit by dividing an optimal value for energy capacity of the vehicle battery by the total number of charge level units. The method may further comprise determining the optimal value for energy capacity of the vehicle battery by: receiving energy capacity data for a plurality of vehicle batteries which satisfy newness criteria; determining a first statistical optimal energy capacity of at least a first subset of the plurality of vehicle batteries which satisfy the newness criteria; and identifying the optimal value for energy capacity of the vehicle battery as the first statistical optimal energy capacity. The method may further comprise: identifying at least one other subset of the plurality of vehicle batteries which satisfy the newness criteria, the at least one other subset of the plurality of vehicle batteries being different from the first subset of the plurality of vehicle batteries; and determining a statistical optimal energy capacity of each subset of the at least one other subset of the plurality of vehicle batteries which satisfy the newness criteria, and determining the optimal value for energy capacity of the vehicle battery as the first statistical optimal energy capacity may comprise: identifying the first statistical optimal energy capacity as being closer to an expected optimal energy capacity than the respective statistical optimal energy capacity for each subset of the at least one other subset.

The newness criteria for each vehicle battery of the plurality of vehicle batteries may be at least one criteria selected from a group of criteria consisting of: age of the respective vehicle battery being within a time threshold of a manufacture date of the vehicle battery; age of the respective vehicle battery being within a time threshold of a manufacture date of a vehicle in which the vehicle battery is included; age of the respective vehicle battery being within a time threshold of a release date of a vehicle model for a vehicle in which the vehicle battery is included; and total distance driven by a vehicle in which the respective vehicle battery is included is less than a distance threshold. The newness criteria for each vehicle battery of the plurality of vehicle batteries may comprise: total distance driven by a vehicle in which the respective vehicle battery is included is less than 25,000 kilometers; and age of the respective vehicle battery being within a one year of a release date of a vehicle model for the vehicle in which the respective vehicle battery is included.

Determining a first statistical optimal energy capacity of at least a first subset of the plurality of vehicle batteries which satisfy the newness criteria may comprise: determining a sample mean energy capacity of at least the first subset of the plurality of vehicle batteries. Determining a first statistical optimal energy capacity of at least a first subset of the plurality of vehicle batteries which satisfy the newness criteria may comprise: determining a sample median energy capacity of at least the first subset of the plurality of vehicle batteries. Determining a first statistical optimal energy capacity of at least a first subset of the plurality of vehicle batteries which satisfy the newness criteria may comprise: determining an energy capacity of a peak probability for a Gaussian distribution of at least the first subset of the plurality of vehicle batteries.

Receiving usage data for a plurality of usage events may comprise monitoring, by at least one sensor, energy transferred from the vehicle battery and energy transferred to the vehicle battery. Monitoring, by the at least one sensor, energy transferred from the vehicle battery may include monitoring energy which is output by the vehicle battery to power the vehicle. Monitoring, by the at least one sensor, energy transferred to the vehicle battery may include monitoring energy which is input to the vehicle battery from a regenerative braking system of the vehicle.

According to yet another broad aspect, the present disclosure describes a system comprising: at least one processor; at least one non-transitory processor-readable storage medium having processor-executable instructions stored thereon which when executed cause the at least one processor to: process usage data for a plurality of usage events of a vehicle battery, wherein an energy capacity of the vehicle battery is represented by a total number of charge level units, and a charge level of the vehicle battery is represented by a proportion of the charge level units corresponding to a proportion of energy stored by the vehicle battery to energy capacity of the vehicle battery; calculate an average energy to discharge the vehicle battery by one charge level unit, where calculation of the average energy is based on usage data for at least a subset of the plurality of usage events; and determine health of the vehicle battery as a function of a difference between the average energy to discharge the vehicle battery by one charge level unit to a nominal energy to discharge the vehicle battery by one charge level unit.

The processor-executable instructions may further cause the at least one processor to: identify at least one subgroup of usage events of the plurality of usage events; and qualify at least one subgroup of the at least one subgroup of usage events, wherein the subset of the plurality of usage events includes only subgroups of usage events which have been qualified.

The processor-executable instructions which cause the at least one processor to identify at least one subgroup of usage events may cause the at least one processor to: identify each subgroup of usage events as a respective group of usage events between sequential charge events of the vehicle battery. The processor-executable instructions which cause the at least one processor to identify at least one subgroup of usage events may cause the at least one processor to: identify each subgroup of usage events as a respective group of usage events within a respective time period. The processor-executable instructions which cause the at least one processor to identify at least one subgroup of usage events may cause the at least one processor to: identify each subgroup of usage events as a respective group of a set number of sequential usage events.

The processor-executable instructions which cause the at least one processor to qualify at least one subgroup may cause the at least one processor to: for each subgroup of the at least one subgroup of usage events, qualify the subgroup if at least one metric is satisfied, the at least one metric selected from a group consisting of: a net amount of energy discharged from the vehicle battery over all of the usage events in the subgroup exceeds a select proportion of the energy capacity of the vehicle battery; charge level of the vehicle battery exceeds a threshold of the energy capacity of the vehicle battery at a start of at least one usage event in the subgroup; and each usage event in the subgroup is within a select time threshold. The processor-executable instructions which cause the at least one processor to qualify at least one subgroup may cause the at least one processor to: for each subgroup of the at least one subgroup of usage events, qualify the subgroup if: a net amount of energy discharged from the vehicle battery over all of the usage events in the subgroup exceeds a select proportion of the energy capacity of the vehicle battery; charge level of the vehicle battery exceeds a threshold of the energy capacity of the vehicle battery at a start of at least one usage event in the subgroup; and each usage event in the subgroup is within a select time threshold.

The processor-executable instructions which cause the at least one processor to qualify at least one subgroup may cause the at least one processor to: for each subgroup of the at least one subgroup of usage events, qualify the subgroup if a net amount of energy discharged from the vehicle battery over all of the usage events in the subgroup exceeds 20% of the energy capacity of the vehicle battery.

The subset of the plurality of usage events may includes at least one subgroup of usage events, where a net amount of energy discharged from the vehicle battery over all of the usage events in a subgroup of the at least one subgroup of usage events exceeds a select proportion of the energy capacity of the vehicle battery; and where a net amount of energy discharged from the vehicle battery over a first usage event is less than the select proportion of the energy capacity of the vehicle battery, the processor-executable instructions may further cause the at least one processor to: group the first usage event with at least one sequential usage event as a subgroup of usage events in the at least one subgroup of usage events.

The subset of the plurality of usage events represented in the usage data may include only six most recent qualified subgroups of usage events.

The processor-executable instructions which cause the at least one processor to determine health of the vehicle battery may cause the at least one processor to: determine a difference between the nominal energy to discharge the vehicle battery by one charge level unit and the average energy to discharge the vehicle battery by one charge level unit; determine a numerical representation of degradation of vehicle battery health by dividing the determined difference by the nominal energy to discharge the vehicle battery by one charge level unit; and subtract the numerical representation of degradation of vehicle battery health from a numerical representation of optimal vehicle battery health.

The processor-executable instructions may further cause the at least one processor to determine the nominal energy to discharge the vehicle battery by one charge level unit by dividing an optimal value for energy capacity of the vehicle battery by the total number of charge level units.

The system may further comprise the vehicle battery. The at least one processor, the at least one non-transitory processor-readable storage medium, and the vehicle battery may be included in a vehicle.

The at least one processor and the at least one non-transitory processor-readable storage medium may be included in a computing device remote from a vehicle which includes the vehicle battery.

The system may further comprise at least one sensor to monitor energy transferred from the vehicle battery and energy transferred to the vehicle battery during usage events, and provide the usage data to the at least one processor based on monitored energy transfer. The at least one sensor may be configured to monitor energy transferred from the vehicle battery to power a vehicle. The at least one sensor may be configured to monitor energy input to the vehicle battery from a regenerative braking system of a vehicle.

According to yet another broad aspect, the present disclosure describes a device electrically couplable to a vehicle battery, the device comprising: at least one processor; at least one non-transitory processor-readable storage medium having processor-executable instructions stored thereon which when executed cause the at least one processor to: process usage data for a plurality of usage events of a vehicle battery, wherein an energy capacity of the vehicle battery is represented by a total number of charge level units, and a charge level of the vehicle battery is represented by a proportion of the charge level units corresponding to a proportion of energy stored by the vehicle battery to energy capacity of the vehicle battery; calculate an average energy to discharge the vehicle battery by one charge level unit, where calculation of the average energy is based on usage data for at least a subset of the plurality of usage events; and determine health of the vehicle battery as a function of a difference between the average energy to discharge the vehicle battery by one charge level unit to a nominal energy to discharge the vehicle battery by one charge level unit.

The processor-executable instructions may further cause the at least one processor to: identify at least one subgroup of usage events of the plurality of usage events; and qualify at least one subgroup of the at least one subgroup of usage events, wherein the subset of the plurality of usage events includes only subgroups of usage events which have been qualified.

The processor-executable instructions which cause the at least one processor to identify at least one subgroup of usage events may cause the at least one processor to: identifying each subgroup of usage events as a respective group of usage events between sequential charge events of the vehicle battery. The processor-executable instructions which cause the at least one processor to identify at least one subgroup of usage events may cause the at least one processor to: identify each subgroup of usage events as a respective group of usage events within a respective time period. The processor-executable instructions which cause the at least one processor to identify at least one subgroup of usage events may cause the at least one processor to: identify each subgroup of usage events as a respective group of a set number of sequential usage events.

The processor-executable instructions which cause the at least one processor to qualify at least one subgroup may cause the at least one processor to: for each subgroup of the at least one subgroup of usage events, qualify the subgroup if at least one metric is satisfied, the at least one metric selected from a group consisting of: a net amount of energy discharged from the vehicle battery over all of the usage events in the subgroup exceeds a select proportion of the energy capacity of the vehicle battery; charge level of the vehicle battery exceeds a threshold of the energy capacity of the vehicle battery at a start of at least one usage event in the subgroup; and each usage event in the subgroup is within a select time threshold. The processor-executable instructions which cause the at least one processor to qualify at least one subgroup may cause the at least one processor to: for each subgroup of the at least one subgroup of usage events, qualify the subgroup if: a net amount of energy discharged from the vehicle battery over all of the usage events in the subgroup exceeds a select proportion of the energy capacity of the vehicle battery; charge level of the vehicle battery exceeds a threshold of the energy capacity of the vehicle battery at a start of at least one usage event in the subgroup; and each usage event in the subgroup is within a select time threshold. The processor-executable instructions which cause the at least one processor to qualify at least one subgroup may cause the at least one processor to: for each subgroup of the at least one subgroup of usage events, qualify the subgroup if a net amount of energy discharged from the vehicle battery over all of the usage events in the subgroup exceeds 20% of the energy capacity of the vehicle battery.

The subset of the plurality of usage events may include at least one subgroup of usage events, where a net amount of energy discharged from the vehicle battery over all of the usage events in a subgroup of the at least one subgroup of usage events exceeds a select proportion of the energy capacity of the vehicle battery; and where a net amount of energy discharged from the vehicle battery over a first usage event is less than the select proportion of the energy capacity of the vehicle battery, the processor-executable instructions may further cause the at least one processor to: group the first usage event with at least one sequential usage event as a subgroup of usage events in the at least one subgroup of usage events.

The subset of the plurality of usage events represented in the usage data may include only six most recent qualified subgroups of usage events.

The processor-executable instructions which cause the at least one processor to determine health of the vehicle battery may cause the at least one processor to: determine a difference between the nominal energy to discharge the vehicle battery by one charge level unit and the average energy to discharge the vehicle battery by one charge level unit; determine a numerical representation of degradation of vehicle battery health by dividing the determined difference by the nominal energy to discharge the vehicle battery by one charge level unit; and subtract the numerical representation of degradation of vehicle battery health from a numerical representation of optimal vehicle battery health.

The processor-executable instructions may further cause the at least one processor to determine the nominal energy to discharge the vehicle battery by one charge level unit by dividing an optimal value for energy capacity of the vehicle battery by the total number of charge level units.

The device may further comprise at least one sensor to monitor energy transferred from the vehicle battery and energy transferred to the vehicle battery during usage events, and provide the usage data to the at least one processor based on monitored energy transfer. The at least one sensor may be configured to monitor energy transferred from the vehicle battery to power a vehicle. The at least one sensor may be configured to monitor energy input to the vehicle battery from a regenerative braking system of a vehicle.

According to yet another broad aspect, the present disclosure describes a method of evaluating vehicle battery health, comprising: receiving energy data for a plurality of energy-change events of a vehicle battery, wherein an energy capacity of the vehicle battery is represented by a total number of charge level units, and a charge level of the vehicle battery is represented by a proportion of the charge level units corresponding to a proportion of energy stored by the vehicle battery to energy capacity of the vehicle battery; calculating an average energy change of the vehicle battery corresponding to one charge level unit, where calculating the average energy is based on energy data for at least a subset of the plurality of energy-change events; and determining health of the vehicle battery as a function of a difference between the average energy change of the vehicle battery corresponding to one charge level unit to a nominal energy change of the vehicle battery corresponding to one charge level unit.

BRIEF DESCRIPTION OF THE DRAWINGS

Exemplary non-limiting embodiments are described with reference to the accompanying drawings in which.

DETAILED DESCRIPTION

The present disclosure details systems, methods, and devices for determining vehicle battery health based on energy data for energy-change events. This could include for example charge data collected when the vehicle battery is electrically coupled to a power source, or usage data when the vehicle battery is outputting energy.

Figure 1:
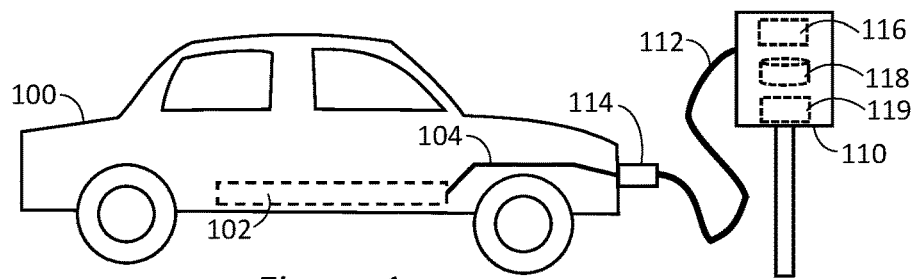
FIGS. 1, 2, 3, and 4 are schematic diagrams of exemplary setups where a vehicle battery is connected to a charging station to charge.

FIG. 1 is a schematic diagram of an exemplary charging system. FIG. 1 illustrates a vehicle 100, having a battery 102, which can receive electrical energy (power) from an external power source by electrical pathway 104. "Electrical pathway" (sometimes shortened to "pathway") as used throughout this disclosure refers to at least one electrically conductive component which provides electrical coupling, such as wires, conductive traces, contacts, or any other appropriate electrically conductive component. An electrical pathway can be a single electrically conductive component (e.g. a single wire), but this is not necessarily the case. For example, an electrical pathway could include a plurality of wires, conductive traces, or contacts. Battery 102 stores received energy.

In the example of FIG. 1, the external power source is charging station 110. Charging station 110 provides power to the vehicle 100 in a format which can be received by vehicle 100 to charge battery 102. In the illustrated example, charging station 110 outputs power by electrical pathway 112 (illustrated as at least one wire) to an electrical couple 114. Electrical couple 114 couples to vehicle 100 (e.g. by a coupling interface such as a plug), to provide a pathway for energy to flow from charging station 110 to battery 102. Charging station 110 receives energy for example from a power grid, solar panels, or any other appropriate source of energy, and converts this energy to a format (e.g. voltage and amperage) acceptable to vehicle 100. Charging station 110 could for example be installed at the vehicle owner's home. As other examples, charging station 110 could be installed in a public location such as a workplace, parking lot, shopping center, rest stop, or any other appropriate location. Additionally, electrical pathway 112 is not limited to being used to provide power to the vehicle. Electrical pathway 112 could also be used for communication of signals between vehicle 100 and charging station 110. To this end, electrical pathway 112 can include a plurality of pathways, such as at least one pathway for provision of power to battery 102, and at least one other pathway for transmission of signals between vehicle 100 and charging station 110.

FIG. 1 also illustrates charging station 110 as including at least one processor 116, at least one non-transitory processor-readable storage medium 118, and at least one sensor 119. Charging station 110 in FIG. 1 is a "smart charging station", in that charging station 110 can do more than just provide energy to vehicle 100. The at least one processor 116 can monitor energy provided by charging station 110, and collect or prepare charge data. For example, the at least one processor 116 can prepare charge data including any of energy flow rate (power), amperage, voltage, time or duration of energy transfer, waveforms representing a combination of attributes, or any other appropriate data. The at least one processor 116 can construct, format, process, or compress the charge data as needed, or the at least one processor 116 can prepare raw charge data. Collection of raw data can be performed using any appropriate hardware, such as the at least one sensor 119. The at least one sensor 119 could include, as non-limiting examples, voltage or current detection circuits, or any other appropriate hardware that can sense electrical attributes. The charge data can be stored in the at least one non-transitory processor-readable storage medium 118. Further, the at least one non-transitory processor-readable storage medium 118 can store instructions which, when executed by the at least one processor 116, cause the at least one processor 116 to prepare the charge data. Further still, the at least one non-transitory processor-readable storage medium 118 can store instructions which, when executed by the at least one processor 116, cause the at least one processor 116 to analyze charge data to estimate battery health of vehicle 100, as is discussed in more detail with reference to FIG. 5 below.

In some implementations, charging station 110 can include at least one communication interface (such as wireless communication hardware, or wired communication hardware). For example, charging station 110 could couple to a vehicle owner's wireless (or wired) network. Charging station 110 can communicate data, such as charge data, or battery health data over the network. Such an implementation is discussed in more detail later with reference to FIG. 3.

Figure 2:
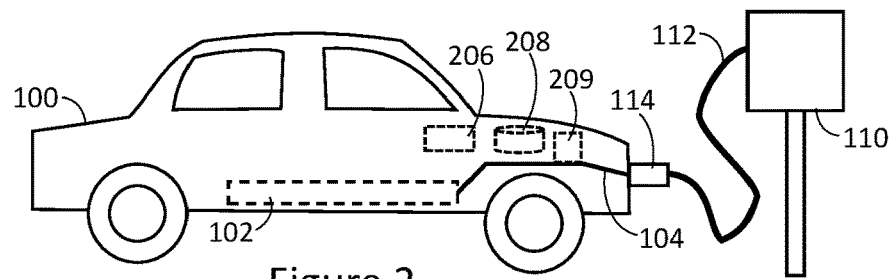

FIG. 2 is a schematic view of an exemplary charging system similar to that illustrated in FIG. 1. Description of elements in FIG. 1 applies to similarly numbered elements in FIG. 2. FIG. 2 includes a vehicle 100 and charging station 110 similar to as described in FIG. 1. One difference between FIG. 2 and FIG. 1 is that in FIG. 2, vehicle 100 is shown as including at least one processor 206, at least one non-transitory processor-readable storage medium 208, and at least one sensor 209. The at least one processor 206 is similar to the at least one processor 116, in that the at least one processor 206 can similarly prepare charge data, and perform analysis of battery health as discussed later with reference to FIG. 5. The at least one non-transitory processor-readable storage medium 208 is similar to the at least one non-transitory processor-readable storage medium 118, in that the at least one non-transitory processor readable storage medium 208 can similarly store instructions or charge data. The at least one sensor 209 is similar to the at least one sensor 119, in that the at least one sensor 209 can monitor charging and collect charge data. FIG. 2 highlights that analysis of charge data and vehicle battery health can occur in vehicle 100 (as opposed to in charging station 110 as in FIG. 1). However, this does not preclude charging station 110 in FIG. 2 from being a "smart charging station" similar to as in FIG. 1, as appropriate for a given application. For example, vehicle battery health analysis could be performed by the at least one processor 206, and transmitted to charging station 110 for review by a vehicle owner (or for further transmission, such as to a remote server). Such a transmission could occur over electrical pathway 112, or could occur via another pathway (such as wireless communication hardware in vehicle 100). As another example, charge data collection could occur in vehicle 100 by the at least one sensor 209, with raw charge data being transmitted to the at least one processor 116 for preparation or analysis. Vehicle 100 in FIG. 1 could also include at least one processor 206 and at least one non-transitory processor-readable storage medium 208, as appropriate for a given application.

Figure 3:
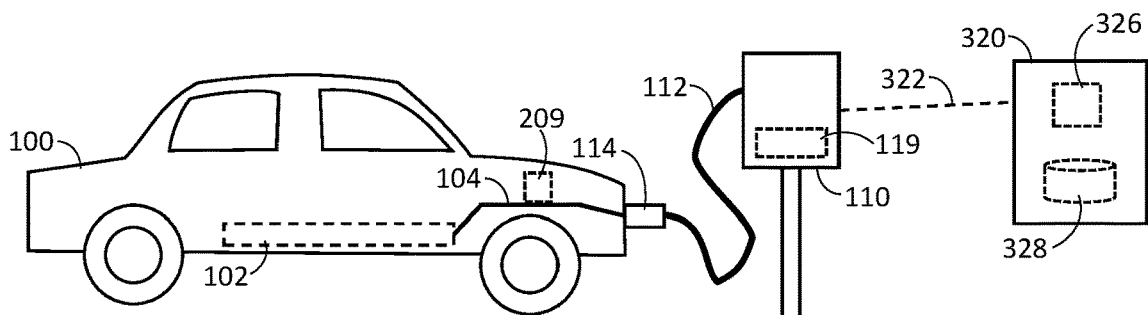

FIG. 3 is a schematic view of an exemplary charging system similar to that illustrated in FIGS. 1 and 2. Description of elements in FIGS. 1 and 2 applies to similarly numbered elements in FIG. 3. FIG. 3 includes a vehicle 100 and charging station 110 similar to as described in FIGS. 1 and 2. One difference between FIG. 3 and FIGS. 1 and 2 is that in FIG. 3, a remote device 320 is illustrated (such as a remote server). Remote device 320 includes at least one processor 326 similar to the at least one processor 116 and the at least one processor 206, in that the at least one processor 326 can similarly perform vehicle battery health analysis. Remote device 320 includes at least one non-transitory processor-readable storage medium 328 which is similar to the at least one non-transitory processor-readable storage medium 118 and the at least one non-transitory processor-readable storage medium 208, in that the at least one non-transitory processor readable storage medium 328 can similarly store instructions or charge data. FIG. 3 illustrates the at least one sensor 119 and the at least one sensor 209, which can monitor charging and collect charge data similar to as discussed above with reference to FIGS. 1 and 2. In some implementations, charge data can be transmitted from charging station 110 to remote device 320 by communication interface 322. Communication interface 322 can for example be a wired connection between charge station 110 and remote device 320. As another example, communication interface 322 can be a wireless connection between charging station 110 and remote device 320. Further, communication interface 322 can be direct as illustrated, or indirect. For example, charging station 110 can connect to a wireless network of a vehicle owner's home (such as to a network router or hub), which in turn is connected to the internet. Remote device 320 can communicate with the home wireless network by the internet.

Although not explicitly illustrated, communication interface 322 can also be between vehicle 100 and remote device 320. For example, vehicle 100 could communicate over a wireless or wired network at the home of the vehicle owner, such that data does not need to be communicated through charging station 110.

Exemplary remote devices 320 could include a vehicle owner's personal computer, smartphone, or other device, or independently managed devices such as a data server of the vehicle manufacturer.

FIG. 3 highlights that analysis of charge data and vehicle battery health can occur remotely from vehicle 100 and charging station 110. However, this does not preclude charging station 110 in FIG. 3 from having at least one processor 116 and at least one non-transitory processor-readable storage medium 118 as in FIG. 1, nor does it preclude vehicle 100 from having at least one processor 206 and at least one non-transitory processor-readable storage medium 208 as in FIG. 2, as appropriate for a given application. For example, preparation of charge data could be performed by the at least one processor 116 in FIG. 1 or the at least one processor 206 in FIG. 2, the charge data subsequently being transmitted to remote device 320. Analysis of the charge data to determine vehicle battery health can then be performed by the at least one processor 326 of remote device 320.

Figure 4:
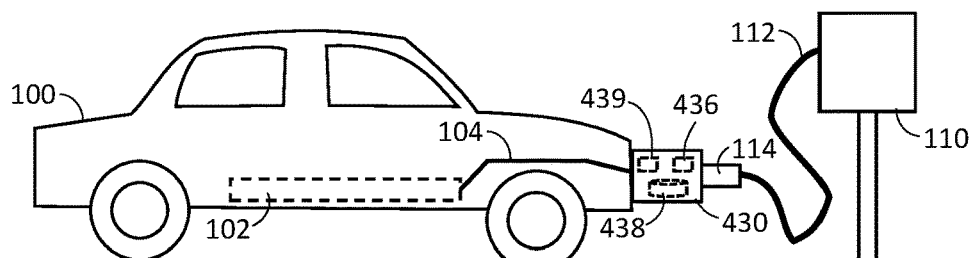

FIG. 4 is a schematic view of an exemplary charging system similar to that illustrated in FIGS. 1, 2, and 3. Description of elements in FIGS. 1, 2, and 3 applies to similarly numbered elements in FIG. 4. FIG. 4 includes a vehicle 100 and charging station 110 similar to as described in FIGS. 1, 2, and 3. One difference between FIG. 4 and FIGS. 1, 2, and 3 is that in FIG. 4, an intermediate device 430 is illustrated. Intermediate device 430 includes at least one processor 436 similar to the at least one processor 116, the at least one processor 206, and the at least one processor 326, in that the at least one processor 436 can similarly prepare charge data, and perform vehicle battery health analysis. Intermediate device 430 includes at least one non-transitory processor-readable storage medium 438 which is similar to the at least one non-transitory processor-readable storage medium 118, the at least one non-transitory processor-readable storage medium 208, and the at least one non-transitory processor-readable storage medium 328, in that the at least one non-transitory processor readable storage medium 438 can similarly store instructions or charge data. Intermediate device 430 includes at least one sensor 439 which is similar to the at least one sensor 119 and the at least one sensor 209, in that the at least one sensor 439 can similarly monitor charging and collect charge data.

Intermediate device 430 is positioned intermediate to vehicle 100 and charging station 110 (illustrated as being coupled between electrical couple 114 and vehicle 100), such that energy provided by charging station 110 to vehicle 100 passes through intermediate device 430. In this way, the at least one sensor 439 can monitor energy provided to vehicle 100, and collect charge data. The at least one sensor 439 can include any appropriate sensors or hardware to enable this, such as voltage or current sensing circuits. In some implementations, this charge data can be analyzed by the at least one processor 436 to determine vehicle battery health, as discussed in detail later with reference to FIG. 5. In other implementations, the at least one sensor 439 can monitor energy provided to vehicle 100, and collect charge data, where this charge data is provided to another device for analysis of vehicle battery health (in some implementations after some preparation by the at least one processor 436, such as compression for formatting). For example, intermediate device 430 could also include a communication interface, through which charge data is transmitted (e.g. to remote device 320 for analysis of vehicle battery health as discussed in detail with reference to FIG. 5). Such a communication interface could be wireless, or could be wired (e.g. through electrical pathway 112).

The inclusion of intermediate device 430 does not preclude charging station 110 from including at least one processor 116 or at least one non-transitory processor-readable storage medium 118 as in FIG. 1, nor does it preclude vehicle 100 from including at least one processor 206 or at least one non-transitory processor-readable storage medium 208 as in FIG. 2. However, intermediate device 430 provides a means for collecting, preparing, analyzing, and/or transmitting charge data, and is particularly useful when other elements of the system lack such functionality. For example, intermediate device 430 is particularly useful for retrofitting systems which lack the ability to collect, prepare, analyze, and/or transmit charge data.

Figure 5:
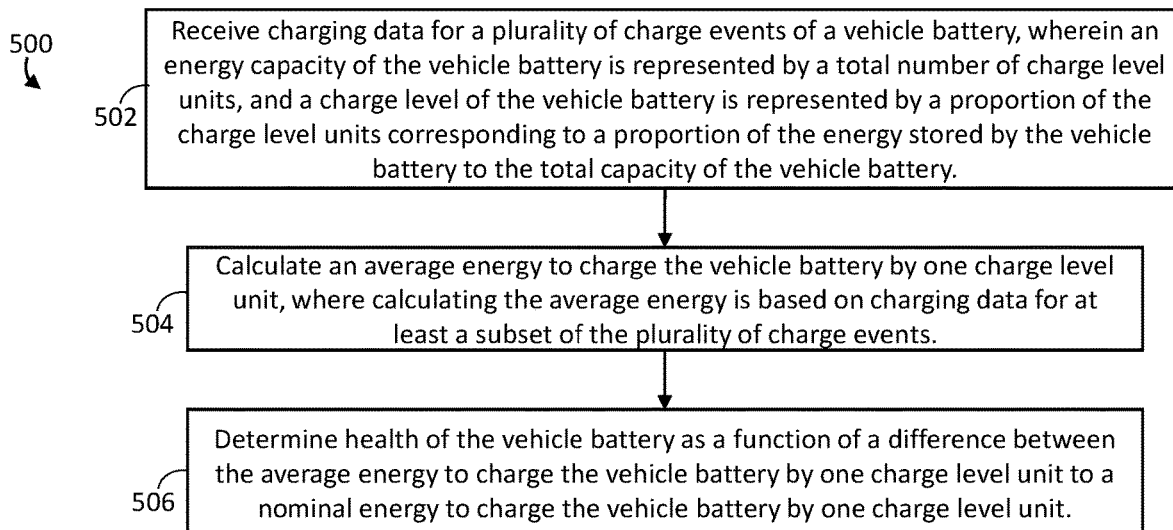
FIGS. 5 and 6 are flowchart diagrams which illustrate exemplary methods for determining battery health based on charge data.

FIG. 5 is a flowchart diagram which illustrates a method 500 for evaluating battery health. Method 500 as illustrated includes acts 502, 504, and 506, though acts could be removed, acts could be added, or acts could be reordered, as appropriate for a given application.

In act 502, charge data for a plurality of charge events of a battery is received. For example, any appropriate sensors, such as any of sensors 119, 209, or 439, can monitor energy transfer and collect data thereon. Any of at least one processor 116, 206, 326, or 436 can prepare, process, or format collected charge data. In this context, a "charge event" refers to a continuous period of time where the vehicle is being charged by an external power source. For example, a charge event could refer to an event where a vehicle owner connects their vehicle to a charging station, and the vehicle charges until the vehicle owner disconnects their vehicle from the charging station. As another example, a charge event could refer to an event where a vehicle owner connects their vehicle to a charging station, and the vehicle charges until the battery is charged to a maximum charge threshold. The maximum charge threshold could be, for example, 100% of the battery capacity. However, this is not necessarily the case; some batteries degrade more quickly when they are fully charged to maximum capacity, so for some scenarios the maximum charge threshold could be less than 100% of the battery capacity (e.g. 80%), to prevent premature battery degradation. As another example, a charge event could end if power supply to the charging station is terminated (e.g. due to a loss of power from the power grid or other power source). Likewise, a charge event could begin when power supply to the charging station is activated (e.g. if the vehicle is plugged in when power is restored after a loss of power; or if the vehicle is plugged in but supply of power is not scheduled to commence until a certain time). At least one processor preparing, formatting, or processing charge data can include parsing charge data into charge events.

Energy capacity of the battery is represented by a total number of charge level units. A charge level of the battery is represented by a proportion of the charge level units corresponding to a proportion of the energy stored by the battery to the total capacity of the battery. In some implementations, energy capacity of a battery can be represented by equally sized charge level units corresponding to a proportion of the energy stored by the battery to the total capacity of the battery. In one particular example, energy capacity of a battery is represented by 100 equally sized charge level units. In the example of 100 charge level units, for a battery that is 50% charged, 50 charge level units (i.e. 50% of 100) represents the charge level of the battery. Different charge levels are indicated by different amounts of charge level units. For example, for a battery that is 25% charged, 25 charge level units (i.e. 25% of 100) represents the charge level of the battery. The example of 100 equally size charge units representing energy capacity of the battery is convenient because it corresponds to percentage values (i.e. the percentage value of charge equals the number of charge level units. However, any appropriate charge level units are possible. In another example, energy capacity of a battery is represented by 1000 equally sized charge level units. In such an example, when a battery is three-quarters charged, or 75% charged, 750 charge level units represent charge level of the battery. Exemplary amounts of charge level units include 10, 50, 100, 200, 300, 500, 1000, or any other appropriate amount.

The above discussion describes energy capacity of a battery being represented by a plurality of charge level units. In some implementations, the represented energy capacity can be the entire possible capacity of the battery (0% energy to 100% energy). However, as mentioned above, some batteries degrade faster when they are charged to the maximum possible energy storage, and thus some batteries may be setup to only charge to an amount of stored energy less than the actual possible energy capacity (e.g. they may only charge to 80% of possible charge level). In such an implementation, the plurality of charge level units may represent usable energy capacity of the battery, instead of the entire possible energy storage capacity of the battery. In the example where the maximum charge of the battery is setup to be at 80% of the total possible energy capacity, the plurality of charge level units can represent charge level of the battery up to 80% of the total energy capacity. Similarly, some batteries degrade faster when charge thereof is depleted below a minimum charge threshold (e.g. 10% of the energy capacity of the battery), and thus some batteries may be setup to only be usable when charge thereof is above the minimum charge threshold (e.g. they may only be usable above 10% of possible charge level). In such an implementation, the plurality of charge level units may represent usable energy capacity of the battery, instead of the entire possible energy storage capacity of the battery. In the example where a minimum charge of the battery is setup to be at 10% of the energy capacity of the battery, the plurality of charge level units can represent charge level of the battery above 10% of the total energy capacity.

In act 504, an average energy to charge the battery by one charge level unit is calculated (e.g. by any of at least one processor 116, 206, 326, or 436). Such a calculation is based on at least a subset of a plurality of charging events represented in the charge data (e.g., certain charge events can be excluded if they don't meet specified metrics, or are too old, to improve accuracy as discussed later). In one example, for a given charge event, the total amount of energy provided to the battery, as well as a change in the charge level (i.e. the number of charge units increased during the charge event) can be included in the charge data. Alternatively, a charge level at the start of the charge event and a charge level at the end of the charge event can be included in the charge data, from which the change in the charge level can be determined. For the charge event, the total amount of energy provided to the battery can be divided by the number of charge units increased, to determine the amount of energy per one charge level unit. This is shown in Formula (1) below:

$$CEPU = \frac{E_T}{CL_e - CL_s} = \frac{E_T}{\Delta CL} \qquad (1)$$

CEPU (Charge Energy Per Unit) refers to the calculated energy transferred to increase charge level of the battery by one unit for the charge event. ET refers to total energy transferred to the battery during the charge event. $CL_e$ refers to the charge level of the battery at the end of the charge event. $CL_s$ refers to the charge level of the battery at the start of the charge event. $\Delta CL$ refers to the difference in charge level between the start of the charge event and the end of the charge event.

The calculation of Formula (1) is performed for a plurality of charge events, to determine a plurality of amounts of energy per one charge level unit. The plurality of amounts of energy per one charge level unit are averaged (each of the amounts is summed together, then divided by the number of amounts). The result is an average energy to charge the battery by one charge level unit. This is shown in Formula (2) below.

$$\overline{CEPU} = \frac{1}{n} \sum_{x=1}^{n} CEPU_x \qquad (2)$$

Where $\overline{CEPU}$ refers to the calculated average energy to charge the battery by one charge level unit for a set of n charge events. $CEPU_x$ refers to the energy to charge the battery by one charge level in one charge event (denoted as charge event x).

By determining average energy to charge the battery by one charge unit, based on data from a plurality of charge events, charging abnormalities can be averaged out.

In act 506, health of the battery is determined (e.g. by any of at least one processor 116, 206, 326, or 436), as a function of a difference between the average energy to charge the battery by one charge level unit to a nominal energy to charge the battery by one charge level unit. Nominal energy to charge the battery by one charge level unit represents the expected energy to charge the battery by one charge level unit for a new or healthy battery. In some implementations, nominal energy to charge the battery by one charge level unit can be provided by a manufacturer of the vehicle or manufacturer of the battery. In other implementations, nominal energy to charge the battery by one charge level unit can be determined from information provided by a manufacturer of the vehicle or manufacturer of the battery. For example, a manufacturer could provide an optimal capacity of a provided battery, and the nominal energy to charge the battery by one charge level unit can be determined by dividing the battery capacity by the number of charge level units. The number of charge level units can be provided by the manufacturer, or can be set as desired for a given system. In some implementations, optimal capacity of a vehicle battery can be determined, such as discussed in detail later with reference to FIG. 7. Generally, the greater the difference between energy required to charge the battery by one charge level unit and nominal energy to charge the battery by one charge level unit, the less healthy the battery.

Figure 6:
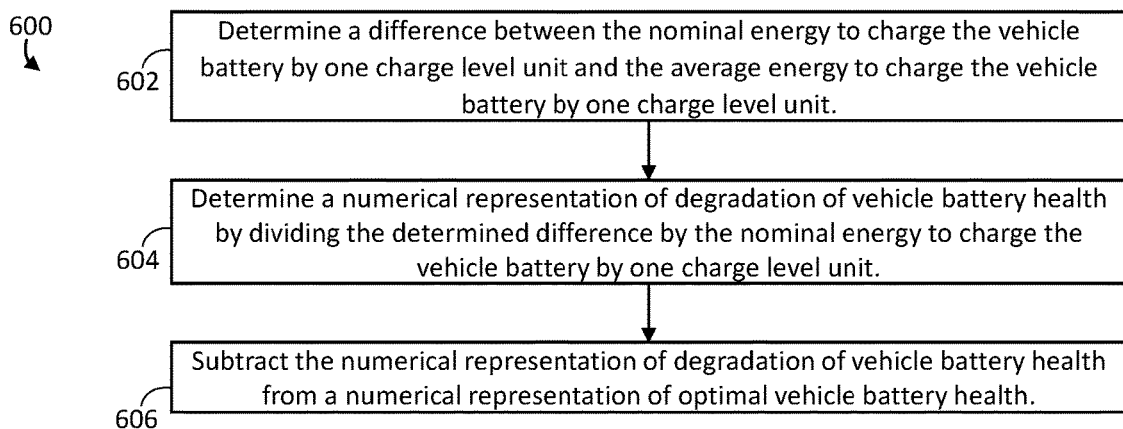

FIG. 6 is a flowchart diagram which illustrates a detailed example method 600 for determining health of a battery as discussed regarding act 506 above. That is, method 600 is a detailed implementation of act 506. Method 600 as illustrated includes acts 602, 604, and 606, though acts could be removed, acts could be added, or acts could be reordered, as appropriate for a given application.

In act 602, a difference between the nominal energy to charge the battery by one charge level unit and the average energy to charge the battery by one charge level unit is determined (e.g. by any of at least one processor 116, 206, 326, or 436).

In act 604, a numerical representation of degradation of battery health is determined (e.g. by any of at least one processor 116, 206, 326, or 436) by dividing the determined difference by the nominal energy to charge the battery by one charge level unit.

In act 606, the numerical representation of degradation of battery health is subtracted (e.g. by any of at least one processor 116, 206, 326, or 436) from a numerical representation of optimal battery health. The result is a numerical representation of present battery health.

Method 600 can be summarized by Formula (3) below:

$$BH_P = BH_O - \frac{CEPU_n - CEPU_a}{CEPU_n} \qquad (3)$$

$BH_P$ is a numerical representation of the present health of the battery; $BH_O$ is a numerical representation of optimal health of the battery (e.g. a new battery); $CEPU_n$ is the nominal energy required to charge the battery by one charge unit; $CEPU_a$ is the calculated average energy required to charge the battery by one charge unit (as calculated in act 504 or Formula (1) above). $BH_O$ can be set to 1, such that $BH_P$ will be some fraction of 1. By multiplying $BH_P$ by 100, $BH_P$ thus represents present battery health as a percentage of optimal battery health.

To ensure $BH_P$ is a fraction of 1, Formula (4) below can be used:

$$BH_P = \max\left(0, \min\left(1, 1 - \frac{CEPU_n - CEPU_a}{CEPU_n}\right)\right) \qquad (4)$$

Formula (4) is similar to Formula (3), except that $BH_P$ is locked to be between 0 and 1. Multiplying $BH_P$ by 100 will result in $BH_P$ representing battery health as a percentage of optimal battery health.

Method 500 in FIG. 5 and method 600 in FIG. 6 can be performed by the hardware illustrated in any of FIGS. 1, 2, 3, and 4. In particular, in any of the systems specified with reference to FIGS. 1, 2, 3, and 4, the described at least one processor can act to performs acts of analysis, determination, identification, calculation, or similar. Any of the at least one non-transitory processor-readable storage mediums can have instructions stored thereon, which when executed by one of the at least one processors cause the system to perform the method 500 or the method 600. Any of the described sensors can perform acts of monitoring charging and collecting charge data.

As mentioned above with reference to FIG. 5, charge data for a subset of a plurality of charge events can be used to calculate average energy to charge the battery by one charge level unit. This subset of a plurality of charge events can be determined as a subset of the plurality of charge events which are considered "qualified" for the purposes of analyzing battery health. In this sense, a "qualified" charge event is a charge event which satisfies a specified metric or a plurality of specified metrics. Limiting analysis to "qualified" charge events reduces the risk that abnormal charge events are included in the analysis, and thus increases accuracy. Prior to performing battery health analysis based on a plurality of charge events, the plurality of charge events can be filtered. That is, each charge event in the plurality of charge events can be analyzed (e.g. by any of the at least one processor 116, 206, 326, or 436) to first compare the charge event to at least one metric, and identify the charge event as a qualified charge event if the at least one metric is satisfied.

One example metric includes an amount of energy transferred to the battery in the charge event. In particular, a metric can be whether an amount of energy transferred to the battery in the charge event exceeds a select proportion of the battery capacity. For example, if an amount of energy transferred to the battery in the charge event exceeds 20% of the battery capacity, the charge event can be considered as a qualified charge event (assuming any other required metrics are satisfied). The select proportion being 20% is merely exemplary, and metrics based on other proportions are possible.

Another example metric includes a charge level of the battery at the end of the charge event. In particular, a metric can be whether a charge level of the battery exceeds a capacity threshold of the battery at the end of the charge event. For example, if the charge level of the battery at the end of the charge event exceeds 79% of the battery capacity, the charge event can be considered as a qualified charge event (assuming any other required metrics are satisfied). The capacity threshold being 79% is merely exemplary, and metrics based on other thresholds are possible.

Yet another example metric includes a rate of energy transfer to the battery during the charge event. In particular, a metric can be whether a rate of energy transfer to the battery exceeds an energy transfer rate threshold. For example, if a rate of energy transfer to the battery in the charge event exceeds 0.6 kW, the charge event can be considered as a qualified charge event (assuming any other required metrics are satisfied). The rate of energy transfer threshold being 0.6 kW is merely exemplary, and metrics based on other rate of energy transfer thresholds are possible. In some implementations, the rate of energy transfer which is compared to the rate of energy transfer threshold can be an average rate of energy transfer over the course of the charge event. In other implementations, the rate of energy transfer which is compared to the rate of energy transfer threshold can be an instantaneous rate of energy transfer. For example, the metric could be satisfied if the rate of energy transfer exceeds the rate of energy threshold at any point during the charge event. In another example, the metric could be satisfied if the rate of energy transfer exceeds the rate of energy threshold throughout the entire charge event (i.e., the rate of energy transfer does not drop below the rate of energy threshold during the charge event).

Yet another example metric includes a duration of the charge event. In particular, a metric can be whether a duration of the charge event is within a time threshold. For example, if the charge event is 24 hours or less, the charge event can be considered as a qualified charge event (assuming any other required metrics are satisfied). The time threshold being 24 hours is merely exemplary, and other time thresholds are possible.

A number of metrics for evaluating whether a charge event is a "qualified" charge event are discussed above. In some implementations, a charge event may be considered qualified if a single metric is satisfied for the charge event. For example, each of the above-discussed metrics could be evaluated for the charge event, and if any of the metrics are satisfied, the charge event can be identified as qualified charge event. As another example, a limited subset of the above-discussed metrics could be evaluated for the charge event (e.g., one, two, or three of the metrics), and if any of the evaluated metrics are satisfied, the charge event can be identified as qualified charge event. In other implementations, a charge event may be considered qualified if a plurality of metrics are satisfied for the charge event. For example, a plurality of the above-discussed metrics could be evaluated for the charge event (e.g., one, two, three, four, or any other metrics), and if all of the evaluated metrics are satisfied, the charge event can be identified as qualified charge event. As another example, a plurality of the above-discussed metrics could be evaluated for the charge event (e.g., one, two, three, four, or any other metrics), and if at least a subset of the evaluated metrics are satisfied, the charge event can be identified as qualified charge event. For example, if four metrics are evaluated, the charge event may be identified as qualified if two of the four metrics are satisfied. Other combinations of number of satisfied metrics and number of evaluated metrics are possible.

In addition to (or alternative to) identifying qualified charge events, determining battery health can be limited to only a subset of recent charge events. For example, determining an average energy to charge the battery by one-charge level as in act 504 discussed above can be limited to averaging charge data from a recent subset of charge events (e.g. the most recent 6, 10, or 15 charge events, and/or only charge events within the last 90, 120, or 180 days) though other numbers of charge events are also possible). Similarly, determining battery health can be limited to only a subset of recent qualified charge events. For example, determining an average energy to charge the battery by one-charge level as in act 504 discussed above can be limited to averaging charge data from a recent subset of qualified charge events (e.g. the most recent 6, 10, or 15 qualified charge events, and/or only charge events within the last 90, 120, or 180 days, though other numbers of qualified charge events are also possible). Determination of whether charge events are qualified or not can be performed before or after a subset of charge events of interest are identified based on how recent the charge events are. For example, from a plurality of charge events, a first subset of charge events can be identified which includes only recent charge events (e.g. the most recent 10 or 15 charge events), then a second subset of charge events within the first subset can be identified by comparing the charge events in the first subset to qualification metrics as discussed above. As an alternative example, from a plurality of charge events, a first subset of qualified charge events can be identified by comparing the charge events in the plurality of charge events to qualification metrics as discussed above, and from the first subset of qualified charge events, a second subset of qualified charge events within the first subset can be identified based on which charge events in the first subset are recent charge events (e.g. the most recent 6, 10, or 15 qualified charge events, and/or only charge events within the last 90, 120, or 180 days). In yet another alternative example, a threshold for recent charge events could be set as a metric, and each charge event could be compared to this recentness metric alongside comparisons to other metrics.

Figure 7:
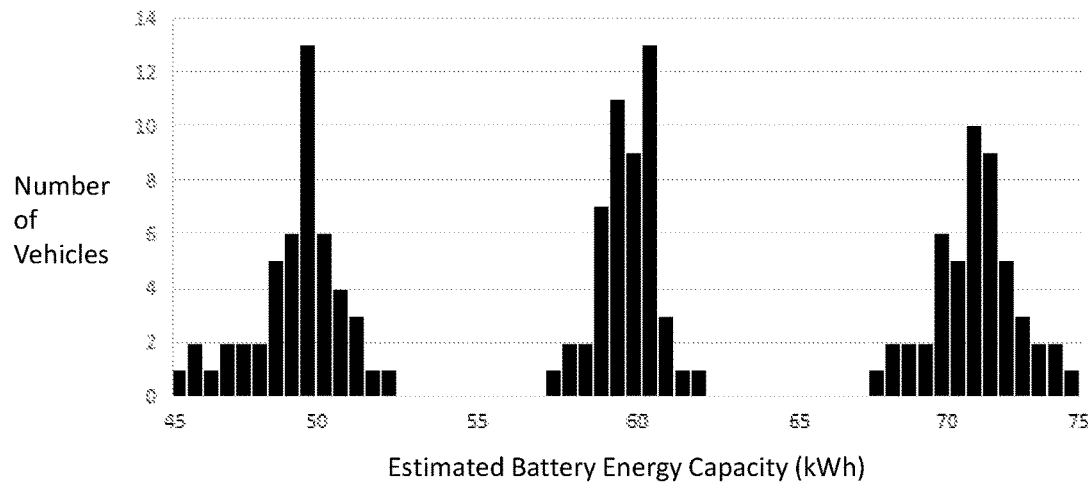
FIG. 7 is a histogram which plots estimated battery capacity for a plurality of vehicles.

FIG. 7 is a histogram which plots estimated battery capacity for a plurality of vehicles in an exemplary scenario. The data shown in FIG. 7 can be used to estimate optimal battery health for a battery included in a given vehicle. Estimating optimal battery capacity can be helpful when battery capacity information is not available from a manufacturer, or when battery capacity information is not accurate or not consistent with real-world use of batteries. For example, some manufacturers may not provide specific information on battery capacity in their vehicles. As another example, some manufacturers may provide battery capacity in a format that is difficult to analyze, such as distance a vehicle can travel on one charge (sometimes referred to as "range"), which is dependent on factors like efficiency of the vehicle, driving conditions, and environment. As another example, some manufacturers may provide battery capacity information, but this information may refer to the total energy capacity of a battery, not useable energy capacity of the battery. As discussed above, some batteries or vehicles may be configured to prevent charging of the battery to full capacity, or to not allow use of the battery below a certain amount of charge, to protect the battery against premature degradation. Nonetheless, total energy capacity of a battery may be the only information provided, but information on usable energy capacity of the battery is more accurate for analyzing battery health. As yet another example, some manufacturers sell vehicle models with different battery capacity options. The energy capacity for a battery in a given vehicle may not be readily identifiable from the VIN (vehicle identification number) of the vehicle, and thus it may not be easy to identify what battery energy capacity option was selected for the vehicle. As yet another example, manufactured battery capacity is not always consistent.

FIG. 7 illustrates a histogram for energy capacities for a plurality of vehicle batteries, where the vehicles satisfy "newness" criteria. Newness criteria are used to filter data, such that only data from vehicles which are relatively "new" are used to determine optimal energy capacity for batteries for a given vehicle model. Specific newness criteria are discussed in detail later. By using only data corresponding to relatively "new" vehicles, the data is representative of vehicle batteries in optimal health, having optimal energy capacity, as discussed in detail later.

Energy capacity data for a plurality of vehicle batteries which satisfy newness criteria is received (e.g. by a processor of an analysis system). This could include receiving such energy capacity data from an external data source, or could include determining or generating such energy capacity data. Estimated battery capacity for each vehicle in FIG. 7 could be determined in a number of different ways. In one example, a vehicle battery could be drained to the minimum usable charge level, then charged to the maximum usable charge level. The amount of energy transferred to the battery during the charge can be measured, and represents energy capacity of the battery. In another example, a vehicle battery could be partially charged, and a difference in charge level before charging and after charging could be measured to determine energy per charge level. This energy per charge level can then be extrapolated over a total number of charge levels of the battery to determine energy capacity of the battery. Such techniques can be performed for each battery in the data set.

Using any appropriate statistical analysis technique (e.g. clustering techniques), at least one subset (cluster) of battery capacities is determined, in order to estimate at least one optimal value for energy capacity of batteries for a given vehicle or vehicle model. In some cases, a given vehicle model can have a plurality of optional battery energy capacities (e.g. a purchaser can choose the battery size in the vehicle). The example illustrated in FIG. 7 is representative of a one-dimensional kernel density estimation performed on data for a sample of vehicle batteries for the same model of vehicle, where each vehicle satisfies newness criteria (as discussed later). To avoid publicizing private real-world data, the data shown in FIG. 7 is hypothetical, but is representative of trends seen in real data. The example illustrates three groups (clusters) of battery sizes. The first group includes 49 vehicles having estimated battery energy capacities ranging from 46 kWh to 53 kWh, with a sample mean of 50.1 kWh. The second group includes 50 vehicles having estimated battery energy capacities ranging from 58 kWh to 62.5 kWh, with a sample mean of 60.3 kWh. The third group includes 50 vehicles having estimated battery energy capacities ranging from 68 kWh to 74 kWh, with a sample mean of 71 kWh. From this, it is determined that there are at least three battery energy capacity options for the vehicle model (three different subsets of vehicle batteries are identified), one option having a sample mean of approximately 50.1 kWh, another option having a sample mean of 60.3 kWh, and yet another option having a sample mean of 71 kWh. "Sample mean" in this case refers to a value determine by summing all of the energy capacity samples in a group, and dividing the result by the number of energy capacity samples in the group.

Calculated sample mean energy capacity for each battery option could be identified as an estimated optimal battery energy capacity for the given battery option. More broadly, however, estimated optimal energy capacity for each battery option can be expressed as a "statistical optimal" energy capacity for each battery option. That is, any appropriate statistical analysis technique can be used which results in an estimated optimal energy capacity for a given group (cluster) of energy capacity estimates as in FIG. 7, even if the estimated optimal energy capacity does not equal a sample mean for the group. As one example, a sample median for each battery option could be identified as estimated optimal battery energy capacity for the given battery option. As another example, a peak probability for a Gaussian distribution could be identified as estimated optimal battery energy capacity for the given battery option. That is, energy capacity data for a group of batteries can be fit to a Gaussian distribution, and the energy capacity corresponding to the peak of the Gaussian distribution can be identified as estimated optimal battery capacity for the given battery option.

Based on the information above, in order to analyze battery health for a given vehicle as discussed above with reference to FIGS. 5 and 6, an expected optimal value for energy capacity of the battery in the given vehicle can be provided to the at least one processor performing the analysis (e.g. the at least one processor 116, 206, 326, or 436). For example, energy capacity of the battery provided by the manufacturer could be retrieved from a database. As another example, an owner of the vehicle for which battery health is being analyzed could input an expected optimal value for energy capacity of the battery. Based on this, the optimal value for energy capacity of the battery for which battery health is being analyzed can be determined by identifying the statistical optimal energy capacity of the subset of vehicles shown in FIG. 7 which is closest to the expected optimal energy capacity. In some examples, the optimal value for energy capacity of the battery for which battery health is being analyzed can be determined as matching a statistical optimal energy capacity which is closer to the expected optimal energy capacity than other statistical optimal energy capacities identified for the plurality of vehicles as shown in FIG. 7. As an example, a user could own a vehicle, corresponding to the vehicle model analyzed in FIG. 7, with an advertised battery energy capacity of 75 kWh. Based on the above analysis of the data in FIG. 7, using sample mean as the statistical optimal energy capacity, the optimal energy capacity for the battery can be assumed to be 71 kWh (the sample mean for the third group). This is because the statistical optimal energy capacity for this third group is closer to the expected battery energy capacity of 75 kWh than the statistical optimal energy capacities for the other groups.

Alternatively, the optimal value for energy capacity of the battery of the vehicle for which battery health is being analyzed can be determined by identifying energy capacity boundaries for each subset of vehicle batteries shown in FIG. 7. For example, such boundaries could be the minimum and maximum estimated energy capacities in the subset, or a select number of standard deviations away from the statistical optimal energy capacity of the group. The optimal value for energy capacity of the battery for which battery health is being analyzed can be determined as the statistical optimal energy capacity for the subset of batteries where the expected optimal value for energy capacity fits within the boundaries. As an example, a user could own a vehicle corresponding to the vehicle model analyzed in FIG. 7, with an advertised battery energy capacity of 62 kWh. As mentioned above in the analysis of the data in FIG. 7, the second subset of vehicles includes 50 vehicles having estimated battery energy capacities ranging from 58 kWh to 62.5 kWh (which can be identified as minimum and maximum boundaries, respectively, for the second subset). The expected optimal battery energy capacity of 62 kWh is within these boundaries, so the optimal energy capacity for the battery can be assumed to be 60.3 kWh (the statistical optimal energy capacity for the second group, when sample mean is used as the statistical optimal energy capacity).

In some implementations, when determining optimal value for energy capacity of the battery of the vehicle for which battery health is being analyzed, analysis can account for manufacturer-advertised battery energy capacities commonly being higher than usable battery energy capacities, as detailed above. For example, optimal energy capacity of the battery of the vehicle for which battery health is being analyzed can be determined by identifying a statistical optimal energy capacity which is closest to, but still lower than, an expected optimal battery capacity. As one example, a user could own a vehicle corresponding to the vehicle model analyzed in FIG. 7, with an advertised battery energy capacity of 57 kWh. Based on the above analysis of the data in FIG. 7, using sample mean as the statistical optimal energy capacity, the optimal energy capacity for the battery can be assumed to be 50.1 kWh (the sample mean for the first group). The sample mean energy capacity for the second group (60.3 kWh) is closer to the expected optimal energy capacity of 57 kWh, compared to the sample mean energy capacity for the first group (50.1 kWh). However, because the sample mean energy capacity for the second group is higher than expected optimal energy capacity, the sample mean energy capacity for the first group is identified as the optimal energy capacity instead, because the sample mean energy capacity for the first group is lower than the expected optimal energy capacity. Similar discussion applies to when optimal energy capacity is identified based on boundaries of the subsets of battery energy capacities.

In some implementations, expected optimal energy capacity of a battery for which battery health is being analyzed may not be available. For example, manufacturer provided energy capacity data may not be available, or may be in a difficult-to-analyze format as mentioned above. As another example, a selected battery option may not be readily be discernable from a vehicle by the VIN number or vehicle model. In such cases, optimal battery energy capacity can be inferred based on age of the vehicle. Battery energy capacity commonly degrades at approximately 2% per year (though an exact degradation amount can vary from vehicle to vehicle, from battery to battery, and based on conditions in which the battery is used). Based on this, if the vehicle model represented by the data in FIG. 7 is a model manufactured 5 years ago, assuming a degradation amount of 2% every year from the original energy capacity of the battery, batteries in said vehicle model can be estimated to have degraded to have 10% less energy capacity compared to when the batteries were new. This model of multiplying a degradation amount by a period of time is one possibility. An alternative possibility is provided in Formula (5) below:

$$EC_P = EC_O(1-d)^y \quad (5)$$

$EC_P$ refers to present energy capacity of the battery, $EC_O$ refers to optimal energy capacity of the battery, d refers to a degradation amount per year as a decimal value, and y refers to the age of the battery in years (e.g. from manufacture date of the battery or the vehicle, or from release date of the vehicle model). Notably, $EC_P$ as modeled by Formula (5) accounts for a degradation in battery capacity based on a previous year's capacity. That is, instead of modeling battery capacity as degrading by d from the optimal energy capacity $EC_O$ every year, energy capacity is modeled as degrading by d from the energy capacity of the previous year. In the example where d=0.02 (2% degradation per year), Formula (5) will model $EC_P$ for a given year as being 98% of the energy capacity of the previous year). Formula (5) can be reversed to estimate optimal energy capacity based on present energy capacity, as shown in Formula (6) below:

$$EC_O = \frac{EC_P}{(1-d)^y} \quad (6)$$

In the above example where the vehicle battery is 5 years old (y=5), battery degradation is assumed to be 2% per year (d=0.02), and if the present energy capacity of the vehicle is 62 kWh ($EC_P$=62 kWh), $EC_O$ can be calculated using Formula (6) as 68.59 kWh. Using sample mean as the statistical optimal energy capacity, optimal energy capacity of the battery can be identified as 71 kWh, the statistical optimal energy capacity for the third group of vehicle batteries in FIG. 7. This is because this is the statistical optimal energy capacity to which 68.59 kWh is closest to (or because 68.59 kWh is within the boundaries of minimum and maximum energy capacities of the third group of 68 kWh and 74 kWh).

The data and results presented for FIG. 7 are merely exemplary. For a given vehicle model, any appropriate number of data subsets (clusters; battery energy capacity options) could be identified, having any appropriate energy capacity values.

As mentioned above, FIG. 7 illustrates estimated battery capacity for a plurality of vehicles which satisfy "newness" criteria. Newness criteria refers to criteria which are used to select vehicle batteries which are relatively new and thus are close to optimal health (and thus have optimal energy capacity). One exemplary newness criteria could be an age of the vehicle or an age of the battery. That is, if the vehicle (or battery) was manufactured within a threshold time period, the newness criteria can be satisfied. Alternatively, since manufacture date may not be readily discernable for a given vehicle or battery, the time period could be set as a threshold time period from an initial release date of the vehicle model. For example, the time period could be set as one year from the manufacture date of the vehicle or one year from the release date of the vehicle model. Setting the threshold time period as one year is merely exemplary, and any appropriate threshold time period could be selected.

Another exemplary newness criteria could be mileage of a vehicle. That is, if the vehicle has driven less than a threshold distance, the newness criteria can be satisfied. Mileage could be identified for example by reading the odometer. As an example, if a vehicle has driven less than 25,000 kilometers, the newness criteria can be satisfied. Setting the threshold distance as 25,000 kilometers is merely exemplary, and any appropriate threshold distance could be selected.

Any appropriate newness criteria can be used. Further, any appropriate number of newness criteria can be used, in combination or separately. Newness criteria could be selected from a group of criteria including each of the above-discussed newness criteria. For example, the newness criteria for each vehicle battery of the plurality of vehicle batteries can be at least one criteria selected from a group of criteria consisting of: age of the respective vehicle battery being within a time threshold of a manufacture date of the vehicle battery; age of the respective vehicle battery being within a time threshold of a manufacture date of a vehicle in which the vehicle battery is included; age of the respective vehicle battery being within a time threshold of a release date of a vehicle model for a vehicle in which the vehicle battery is included; and total distance driven by a vehicle in which the respective vehicle battery is included is less than a distance threshold. Such selection could include one criteria, a plurality of criteria, all of the criteria, or even other newness criteria now specifically mentioned. As one example, newness criteria could be selected such that less than one year has passed since a release date of the vehicle model corresponding to the vehicle which contains the battery, and the vehicle has driven less than 25,000 kilometers. With such newness criteria, degradation of the battery is usually between 0.5% and 4% (and is further usually within 0.5% and 2%). By collecting and analyzing data from vehicles which satisfy newness criteria, optimal energy capacity (or capacity options) for a given model can be estimated, which can be more accurate than energy capacity data from other sources.

The techniques and methods discussed with reference to FIG. 7 could be performed by any appropriate processing device. For example, the at least one processor 326 could determine optimal value for energy capacity for a battery for a vehicle model or battery option, which could be transmitted and/or used by the at least one processor 116, 226, 326, or 436 to analyze vehicle battery health for the battery in a particular vehicle. The techniques and methods discussed with reference to FIG. 7 can be performed in advance of analysis of health for a given vehicle battery, and a resulting optimal value for energy capacity of a battery could be stored on any appropriate storage medium, such that the at least one non-transitory processor-readable storage medium 118, 208, 328, or 438.

Figure 8:
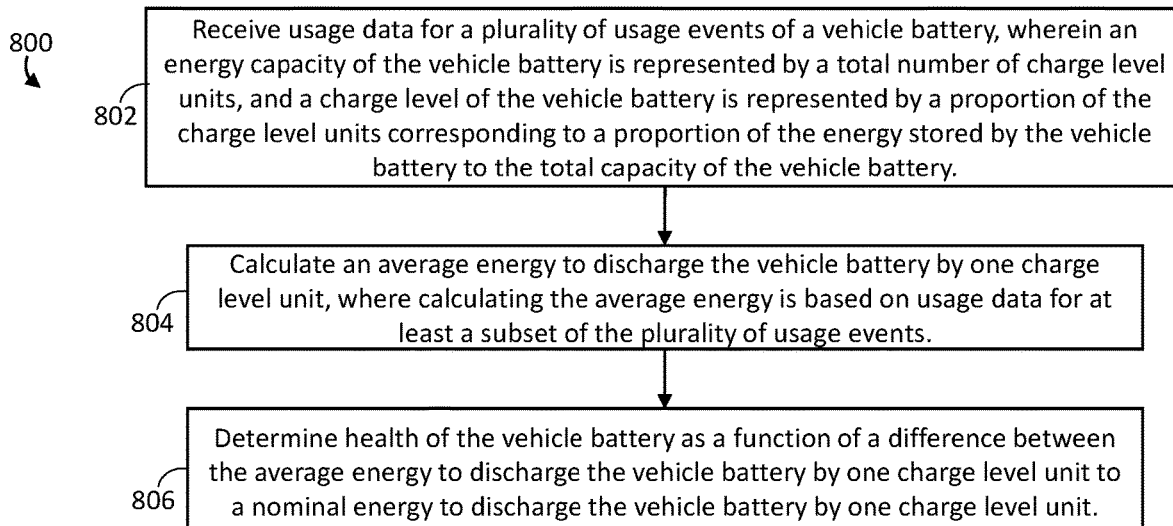
FIGS. 8 and 9 are flowchart diagrams which illustrate exemplary methods for determining battery health based on usage data.

FIG. 8 is a flowchart diagram which illustrates a method 800 for evaluating battery health. Method 800 as illustrated includes acts 802, 804, and 806, though acts could be removed, acts could be added, or acts could be reordered, as appropriate for a given application.

In act 802, usage data for a plurality of usage events of a battery is received. In this context, a "usage event" refers to a period of time where a vehicle is used. For example, a usage event could refer to an event where a vehicle user drives a vehicle. As another example, a usage event could refer to an event where a vehicle user utilizes elements of a vehicle aside from driving (e.g., running auxiliary functions like a heater, air-conditioning, lights, etcetera). As yet another example, a usage event could refer to an event where a vehicle user drives a vehicle and uses auxiliary elements of the vehicle. A usage event could begin when a vehicle is first activated (e.g. insertion of a key or fob, or activation of a Start button) until the vehicle is deactivated (e.g. removal of the key or fob, or deactivation of the Start button). As another example, a usage event could begin at the first significant usage of energy by the vehicle, such as when the accelerator is pressed. Such a usage event could end when the vehicle stops moving.

Commonly, over the course of a usage event, charge level of a vehicle battery will decrease. However, this does not mean that charge level of the vehicle battery continuously or constantly decreases during the usage event. For example, an electric vehicle can be equipped with a regenerative braking system, which charges the vehicle battery during operation of the vehicle (when the vehicle is braking). As a result, charge level of a vehicle battery may fluctuate up and down over the course of a usage event. As another example, a vehicle may be equipped with at least one solar panel which captures solar energy to charge the vehicle battery. It is possible for charge level of the vehicle battery to increase over a usage event (e.g. for a drive which is mostly downhill, such that little energy is expended to move the vehicle, and a regenerative braking system captures significant energy from braking during the drive). Commonly, however, a usage event results in a net discharge of energy from the vehicle battery.

Any appropriate sensor can monitor energy transferred from the vehicle battery and energy transferred to the vehicle battery during usage events, and provide the usage data to at least one processor based on the monitored energy transfer. For example, sensor 209 included in a vehicle can monitor energy transferred to or from a vehicle battery, and collect data thereon. Sensor 209 could for example be an electrical sensor or collection of electrical sensors integrated in the vehicle which monitor flow of energy to and from the vehicle battery. As an example, sensor 209 can be configured to monitor energy output by the vehicle battery to power the vehicle. As another example, sensor 209 can be configured to monitor energy input to the vehicle battery from a regenerative braking system of a vehicle. As another example, sensor 209 could be a sensor installed in the vehicle (such as an integrated sensor, or an aftermarket sensor which attaches to an electrical port such as the OBDII port) which receives data indicative of a charge level or change in charge level of the vehicle battery, which is indicative of usage of the vehicle.

Any of at least one processor 116, 206, 326, or 436 can prepare, process, or format collected usage data. Usage data is commonly generated when a vehicle is not connected to a charge station (such as when a vehicle is being driven). As such, preparation, processing, or formatting of collected usage data can be performed by a processor carried by a vehicle, such as processor 206. Alternatively, usage data can be provided to a charge station after the vehicle is connected to the charge station, and a processor of the charge station (e.g. processor 116) can perform preparation, processing, or formatting of the usage data. Still alternatively, usage data can be provided to a device remote from the vehicle (e.g. remote device 320), and a processor of the remote device (e.g. processor 326) can perform preparation, processing, or formatting of collected usage data. The usage data could be provided to the remote device in any appropriate manner, such as by wireless communication (e.g. cellular communication), or via a charge station to which the vehicle is connected (e.g. after the usage event). Still alternatively, usage data could be provided to an intermediate device (e.g. intermediate device 430) coupled to the vehicle, and a processor of the intermediate device (e.g. processor 436) can perform preparation, processing, or formatting of collected usage data. In some implementations, different processors could perform different operations on the usage data. In one non-limiting example, a processor of the vehicle (e.g. processor 206) can perform formatting and compression of usage data, for transmission to a remote device (e.g. remote device 320). The remote device can receive the formatted and compressed usage data, and a processor of the remote device (e.g. processor 326) can perform battery health analysis processing based on this formatted and compressed usage data (including any appropriate interpretation or decompression). Other combinations of operations performed by different processors could be implemented, as appropriate for a given application.

Similar to as discussed above with reference to FIG. 5, energy capacity of the battery is represented by a total number of charge level units. A charge level of the battery is represented by a proportion of the charge level units corresponding to a proportion of the energy stored by the battery to the total capacity of the battery. The discussion of FIG. 5 regarding how energy capacity of the battery is represented is fully applicable to the implementation of FIG. 8 as well, and is not repeated for brevity.

In act 804, an average energy to discharge the battery by one charge level unit is calculated (e.g. by any of at least one processor 116, 206, 326, or 436). Such a calculation is based on at least a subset of a plurality of usage events represented in the usage data (e.g., certain usage events can be excluded if they don't meet specified metrics, or certain usage events can be grouped together in at least one subgroup, to improve accuracy as discussed later). In one example, for a given usage event (or subgroup of usage events), the total amount of energy discharged from the battery, as well as a change in the charge level (i.e. the number of charge units decreased during the usage event or subgroup of usage events) can be included in the usage data. Alternatively, a charge level at the start of the usage event or subgroup of usage events and a charge level at the end of the usage event or subgroup of usage events can be included in the usage data, from which the change in the charge level can be determined. For the usage event or subgroup of usage events, the total amount of energy discharged from the battery can be divided by the number of charge units decreased, to determine the amount of energy per one charge level unit. This is shown in Formula (7) below:

$$DEPU = \frac{E_N}{CL_s - CL_e} = \frac{E_N}{\Delta CL} \quad (7)$$

DEPU (Discharge Energy Per Unit) refers to the calculated energy transferred from the battery which corresponds to a decrease in one charge level unit of the battery, for the usage event or subgroup of usage events. $E_N$ refers to net energy transferred from the battery during the usage event or subgroup of usage events. $CL_e$ refers to the charge level of the battery at the end of the usage event or subgroup of usage events. $CL_s$ refers to the charge level of the battery at the start of the usage event or subgroup of usage events. $\Delta CL$ refers to the difference in charge level between the start and the end of the usage event or subgroup of usage events.

The calculation of Formula (7) is performed for a plurality of usage events or a plurality of subgroups of usage events, to determine a plurality of amounts of energy per one charge level unit (plurality of DEPUs). The plurality of amounts of energy per one charge level unit are averaged (each of the DEPUs is summed together, then divided by the number of DEPUs). The result is an average energy to discharge the battery by one charge level unit. This is shown in Formula (8) below.

$$\overline{DEPU} = \frac{1}{n}\sum_{x=1}^{n} DEPU_x \quad (8)$$

Where $\overline{DEPU}$ refers to the calculated average energy to discharge the battery by one charge level unit for a set of n usage events or a set of n subgroups of usage events. $DEPU_x$ refers to the energy to discharge the battery by one charge level unit in one usage event or one subgroup of usage events (denoted as usage event x or subgroup of usage events x).

By determining average energy to discharge the battery by one charge unit, based on data from a plurality of usage events, discharge abnormalities can be averaged out.

In act 806, health of the battery is determined (e.g. by any of at least one processor 116, 206, 326, or 436), as a function of a difference between the average energy to discharge the battery by one charge level unit to a nominal energy to discharge the battery by one charge level unit. Nominal energy to discharge the battery by one charge level unit represents the expected energy to discharge the battery by one charge level unit for a new or healthy battery. In some implementations, nominal energy to discharge the battery by one charge level unit can be provided by a manufacturer of the vehicle or manufacturer of the battery. In other implementations, nominal energy to discharge the battery by one charge level unit can be determined from information provided by a manufacturer of the vehicle or manufacturer of the battery. For example, a manufacturer could provide an optimal capacity of a provided battery, and the nominal energy to discharge the battery by one charge level unit can be determined by dividing the battery capacity by the number of charge level units. The number of charge level units can be provided by the manufacturer, or can be set as desired for a given system. In some implementations, optimal capacity of a vehicle battery can be determined, such as discussed in detail above with reference to FIG. 7, and nominal energy to discharge the battery by one charge level unit can be determined by dividing the determined optimal battery capacity by the number of charge level units. Generally, the greater the difference between energy required to discharge the battery by one charge level unit and nominal energy to discharge the battery by one charge level unit, the less healthy the battery.

Figure 9:
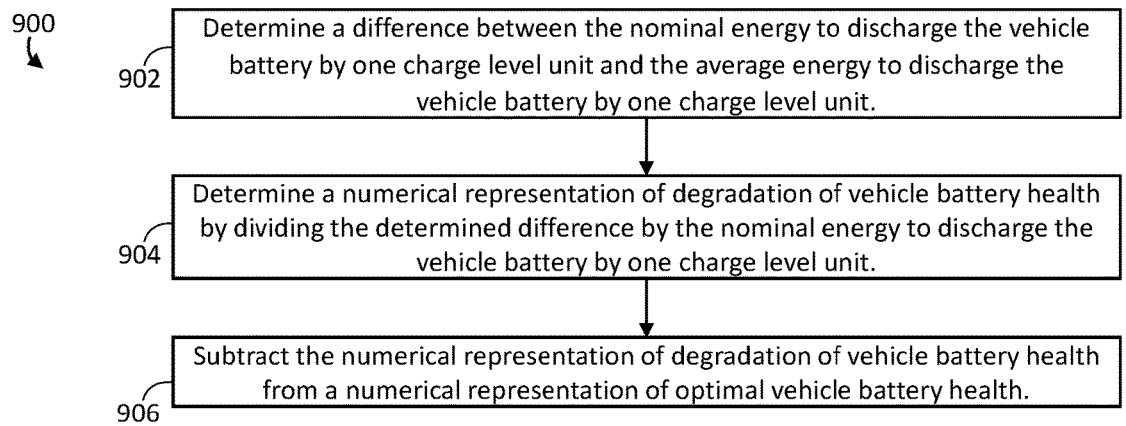

FIG. 9 is a flowchart diagram which illustrates a detailed example method 900 for determining health of a battery as discussed regarding act 806 above. That is, method 900 is a detailed implementation of act 806. Method 900 as illustrated includes acts 902, 904, and 906, though acts could be removed, acts could be added, or acts could be reordered, as appropriate for a given application.

In act 902, a difference between the nominal energy to discharge the battery by one charge level unit and the average energy to discharge the battery by one charge level unit is determined (e.g. by any of at least one processor 116, 206, 326, or 436).

In act 904, a numerical representation of degradation of battery health is determined (e.g. by any of at least one processor 116, 206, 326, or 436) by dividing the determined difference by the nominal energy to discharge the battery by one charge level unit.

In act 906, the numerical representation of degradation of battery health is subtracted (e.g. by any of at least one processor 116, 206, 326, or 436) from a numerical representation of optimal battery health. The result is a numerical representation of present battery health.

Method 900 can be summarized by Formula (9) below:

$$BH_P = BH_O - \frac{DEPU_n - DEPU_a}{DEPU_n} \quad (9)$$

$BH_P$ is a numerical representation of the present health of the battery; $BH_O$ is a numerical representation of optimal health of the battery (e.g. a new battery); $DEPU_n$ is the nominal energy required to discharge the battery by one charge unit; $DEPU_a$ is the calculated average energy required to discharge the battery by one charge unit (as calculated in act 804 or Formula (7) above). $BH_O$ can be set to 1, such that $BH_P$ will be some fraction of 1. By multiplying $BH_P$ by 100, $BH_P$ thus represents present battery health as a percentage of optimal battery health.

To ensure $BH_P$ is a fraction of 1, Formula (10) below can be used:

$$BH_P = \max\left(0, \min\left(1, 1 - \frac{DEPU_n - DEPU_a}{DEPU_n}\right)\right) \quad (10)$$

Formula (10) is similar to Formula (9), except that $BH_P$ is locked to be between 0 and 1. Multiplying $BH_P$ by 100 will result in $BH_P$ representing battery health as a percentage of optimal battery health.

Method 800 in FIG. 8 and method 900 in FIG. 9 can be performed by the hardware illustrated in any of FIGS. 1, 2, 3, and 4. In particular, in any of the systems specified with reference to FIGS. 1, 2, 3, and 4, the described at least one processor can perform acts of analysis, determination, identification, calculation, or similar. Any of the at least one non-transitory processor-readable storage mediums can have instructions stored thereon, which when executed by one of the at least one processor cause the system to perform the method 800 or the method 900. Any appropriate sensor can perform acts of monitoring energy transfer and collecting usage data.

As mentioned above with reference to FIG. 8, usage data for a subset of a plurality of usage events can be used to calculate average energy to discharge the battery by one charge level unit. This subset of a plurality of usage events can be determined as a subset of the plurality of usage events which are considered "qualified" for the purposes of analyzing battery health. In this sense, a "qualified" usage event is a usage event which satisfies a specified qualification metric or a plurality of specified qualification metrics. Limiting analysis to "qualified" usage events reduces the risk that abnormal usage events are included in the analysis, and thus increases accuracy. Prior to performing battery health analysis based on a plurality of usage events, the plurality of usage events can be filtered. That is, each usage event in the plurality of usage events can be analyzed (e.g. by any of the at least one processor 116, 206, 326, or 436) to compare the usage event to at least one metric, and qualify the usage event as a qualified usage event if the at least one metric is satisfied.

In many cases, a single usage event by itself may not satisfy qualification metrics. Further, in some scenarios, there may be few usage events for a vehicle which satisfy qualification metrics by themselves. In such scenarios, there may be insufficient qualified usage events for accurate battery health analysis to be performed. To address this, rather than comparing individual usage events to qualification metrics, usage events can be grouped together into subgroups (of the plurality of usage events). Usage events can be qualified by comparing subgroups of usage events to at least one qualification metric. Each such subgroup could include any number of usage events, as appropriate. For example, a subgroup of usage events could include a single usage event. As another example, a subgroup of usage events could include a plurality of usage events. Several exemplary techniques for identifying at least one subgroup of usage events are discussed later with reference to FIG. 10. In some examples, qualification of a subgroup of at least one usage event can be performed after identification of the subgroup of at least one usage event. In other examples, qualification of a subgroup of at least one usage event can be performed concurrently with identification of the subgroup of at least one usage event. The subset of the plurality of usage events as discussed with reference to act 804 of method 800 in FIG. 8 can be restricted to only include subgroups of at least one usage event which have been qualified.

Several examples of how usage events or subgroups of usage events can be qualified are discussed below. The below discussion in particular refers to qualification of subgroups of usage events, but is still applicable to qualification of single usage events (for example where a subgroup of usage events includes a single usage event).

In a first example, a subgroup of at least one usage event can be qualified if a net amount of energy discharged from the vehicle battery over all of the usage events in the subgroup exceeds a select proportion of the energy capacity of the vehicle battery. That is, a subgroup of at least one usage events may be qualified if a change in charge level of the vehicle battery is high enough over the course of all the usage events in the subgroup of at least one usage event. As an example, the select proportion of the energy capacity of the vehicle battery can be 20%, though any other select proportion of the energy capacity of the vehicle battery could be used as appropriate for a given application.

In a second example, a subgroup of at least one usage event can be qualified if a charge level of the vehicle battery exceeds an energy threshold of the vehicle battery at a start of (prior to) the subgroup of at least one usage event. In some implementations, this can mean that if the charge level of the battery is high enough at a start of the first usage event in the subgroup, the subgroup of usage events can be qualified. In other implementations, this can mean that if the charge level of the battery is high enough at a start of at least one (any one) usage event in the subgroup, the subgroup of usage events can be qualified. As an example, the energy threshold can be set as 80% of the energy capacity of the vehicle battery, though any other energy threshold could be set as appropriate for a given application. In some implementations, the energy threshold is set based on actual total energy capacity of the vehicle battery; for example usable energy capacity of the battery may be restricted to 80% of actual total energy capacity of the battery (to preserve health of the battery as discussed earlier), and the energy threshold may also be set at 80% of the actual total energy capacity of the battery. Effectively, this results in the energy threshold being set at the charge level corresponding to the maximum allowed charge of the battery, however a different energy threshold could be set as appropriate for a given application. In other implementations, the energy threshold is set based on usable energy capacity of the battery. For example, the energy threshold may be set at 100% of the usable energy capacity of the battery (maximum allowable charge level). However a different energy threshold could be set as appropriate for a given application; for example, the energy threshold may be set at 80% of the usable energy capacity of the battery.

In a third example, a subgroup of at least one usage event can be qualified if each usage event in the subgroup is within a select time threshold. That is, a subgroup can be qualified if each usage event in the subgroup is within a close enough timeline. For example, the select time threshold could be set as one week, such that all usage events within the subgroup must occur within a week of each other in order for the subgroup to be qualified. Any other time threshold could be used as appropriate for a given application. Qualification of a subgroup of usage events could be based on start time of each usage event, end time of each usage event, or both. In one exemplary implementation, a subgroup could be qualified if each usage event within the subgroup fits entirely within the time threshold (that is, time from a start of the first usage event to an end of the last usage event is within the time threshold). In another exemplary implementation, a subgroup could be qualified if each usage event within the subgroup fits at least partially within the time threshold (that is, time from an end of the first usage event to a start of the last usage event is within the time threshold). In yet another exemplary implementation, qualification of the subgroup of at least one usage event could only account for start times of usage events (that is, time from a start of the first usage event to a start of the last usage event is within the time threshold). In yet another exemplary implementation, qualification of the subgroup of at least one usage event could only account for end times of usage events (that is, time from an end of the first usage event to an end of the last usage event is within the time threshold).

In some implementations, qualification of a subgroup of at least one usage event can be based on one metric, such as any of the above discussed metrics. In other implementations, qualification of a subgroup of at least one usage event can be based on a combination of a plurality of metrics, such as any of the above discussed metrics. In one exemplary implementation, a subgroup of at least one usage events may be qualified only if a net amount of energy discharged from the vehicle battery over all of the usage events in the subgroup exceeds a select proportion of the energy capacity of the vehicle battery; charge level of the vehicle battery exceeds a threshold of the energy capacity of the vehicle battery at a start of the usage events in the subgroup; and each usage event in the subgroup is within a select time threshold (that is, all three exemplary metrics discussed above must be satisfied). In another exemplary implementation, a subgroup of at least one usage events may be qualified only if at least two metrics are satisfied. For example, a subgroup of at least one usage event may be qualified if any two of: a net amount of energy discharged from the vehicle battery over all of the usage events in the subgroup exceeds a select proportion of the energy capacity of the vehicle battery; charge level of the vehicle battery exceeds a threshold of the energy capacity of the vehicle battery at a start of the usage events in the subgroup; or each usage event in the subgroup is within a select time threshold. This could be implemented in different ways as appropriate for a given application. In one application, all three metrics could be applied, and if any two are satisfied the subgroup of at least one usage event is qualified.

In other applications, only two of the metrics could be applied, and a subgroup of at least one usage event may only be qualified if both of the applied metrics are satisfied. For example, a subgroup of at least one usage event may be qualified if: a net amount of energy discharged from the vehicle battery over all of the usage events in the subgroup exceeds a select proportion of the energy capacity of the vehicle battery; and charge level of the vehicle battery exceeds a threshold of the energy capacity of the vehicle battery at a start of the usage events in the subgroup. As another example, a subgroup of at least one usage event may be qualified if: charge level of the vehicle battery exceeds a threshold of the energy capacity of the vehicle battery at a start of the usage events in the subgroup; and each usage event in the subgroup is within a select time threshold. As yet another example, a subgroup of at least one usage event may be qualified if: a net amount of energy discharged from the vehicle battery over all of the usage events in the subgroup exceeds a select proportion of the energy capacity of the vehicle battery; and each usage event in the subgroup is within a select time threshold.

Figure 10:
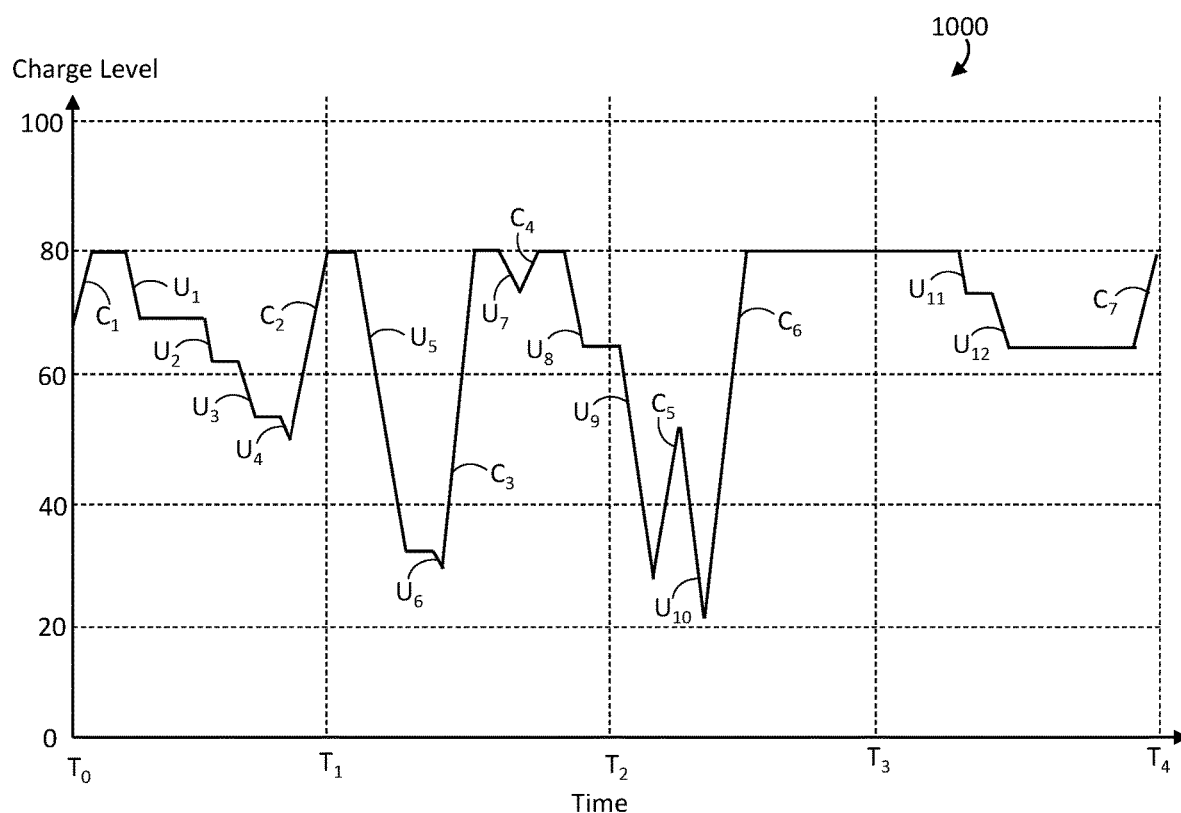
FIG. 10 illustrates a charge plot which shows charge level for an exemplary vehicle battery over time.

FIG. 10 illustrates a charge plot 1000 which shows charge level for an exemplary vehicle battery (in an exemplary vehicle) over time. Charge plot 1000 illustrates several charge events $C_1$, $C_2$, $C_3$, $C_4$, $C_5$, $C_6$, and $C_7$, as well as several usage events $U_1$, $U_2$, $U_3$, $U_4$, $U_5$, $U_6$, $U_7$, $U_8$, $U_9$, $U_{10}$, $U_{11}$, and $U_{12}$. The illustrated charge events and usage events are merely exemplary, and any number or nature of charge events and usage events could occur over a given time frame, as dependent on a scenario in which the vehicle and vehicle battery are implemented or used. Further, the charge level curve shown in FIG. 10 is generally simplified. For example, each of the usage events $U_1$ to $U_{12}$ in FIG. 10 is shown as a smooth downward line, in accordance with many usage events resulting in a general decrease in charge level of the vehicle battery. However, in practice charge level change over a usage event can vary significantly, and can increase or decrease at different times within the usage event. Such variation can be dependent on many factors, including but not limited to usage conditions (e.g. speed, acceleration, travel slope, etc.), recharge mechanisms (e.g. regenerative braking, solar energy, etc.), or any other appropriate mechanism. One skilled in the art will appreciate that the simplified charge level curve of FIG. 10 is not limiting, and that the present disclosure fully applies to complex and variable charge level curves.

Several exemplary methodologies for grouping usage events into subgroups of at least one usage event each are discussed below, with specific reference to the exemplary charge plot 1000 in FIG. 10. One skilled in the art will appreciate that reference to the specific charge plot 1000 is merely illustrative, and the discussed methodologies are fully applicable to any appropriate charge plot.

In a first exemplary implementation, identifying each subgroup of usage events comprises identifying each subgroup of usage events as a respective group of usage events between sequential charge events of the vehicle battery. That is, charge events set boundaries according to which usage events are grouped together. With reference to the example of FIG. 10, usage events $U_1$, $U_2$, $U_3$, and $U_4$ are grouped as a first subgroup, because these usage events occur between charge events $C_1$ and $C_2$; usage events $U_5$ and $U_6$ are grouped as a second subgroup, because these usage events occur between charge events $C_2$ and $C_3$; usage event $U_7$ is an individual usage event which corresponds to a third subgroup, because this is the only usage event which occurs between charge events $C_3$ and $C_4$; usage events $U_8$ and $U_9$ are grouped as a fourth subgroup, because these usage events occur between charge events $C_4$ and $C_5$; usage event $U_{10}$ is an individual usage event which corresponds to a fifth subgroup, because this is the only usage event which occurs between charge events $C_5$ and $C_6$; usage events $U_{11}$ and $U_{12}$ are grouped as a sixth subgroup, because these usage events occur between charge events $C_6$ and $C_7$.

Advantageously the first exemplary implementation incorporates several usage events into qualifiable subgroups, where said usage events would not be individually qualifiable. This is discussed assuming a pair of qualification metrics which require that: a net amount of energy discharged from the vehicle battery over all of the usage events in a subgroup exceeds 20% of the energy capacity of the vehicle battery; and charge level of the vehicle battery exceeds 79% of the energy capacity of the vehicle battery at a start of the usage events in the subgroup. These metrics are discussed in more detail earlier. Further, use of these particular metrics is merely exemplary, and any metric or plurality of metrics could be utilized as appropriate for a given application.

In the first implementation, none of usage events $U_1$, $U_2$, $U_3$, or $U_4$ would be qualifiable individually, since none of these usage events involve a net amount of energy discharged from the vehicle battery which exceeds 20% of the energy capacity of the vehicle battery. Further, none of usage events $U_2$, $U_3$, or $U_4$ would be qualifiable individually, since none of these usage events involve a charge level of the vehicle battery exceeding 79% of the energy capacity of the vehicle battery at a start of the respective usage event. However, when considered as the first subgroup of usage events $U_1$, $U_2$, $U_3$, and $U_4$, a net amount of energy discharged from the vehicle battery is about 30% of the energy capacity of the vehicle battery, which exceeds 20% of the energy capacity of the vehicle battery. Further, a charge level of the vehicle battery exceeds 79% of the energy capacity of the vehicle battery at a start of usage event $U_1$, the first usage event in the first subgroup. Therefore, the first subgroup of usage events as a whole satisfies the qualification metrics, and thus is qualified as usage data for assessing health of the vehicle battery.

Further in the first implementation, usage event $U_5$ is individually qualifiable, since a net amount of energy discharged from the vehicle battery during usage event $U_5$ is approximately 47%, which exceeds 20% of the energy capacity of the vehicle battery, and a charge level of the vehicle battery exceeds 79% of the energy capacity of the vehicle battery at a start of usage event $U_5$. However, usage event $U_6$ would not be qualifiable individually, since a net amount of energy discharged from the vehicle battery during usage event $U_6$ is approximately 3%, which does not exceed 20% of the energy capacity of the vehicle battery. Further, a charge level of the vehicle battery does not exceed 79% of the energy capacity of the vehicle battery at a start of usage event $U_6$. However, when considered as the second subgroup of usage events $U_5$ and $U_6$, a net amount of energy discharged from the vehicle battery is about 50% of the energy capacity of the vehicle battery, which exceeds 20% of the energy capacity of the vehicle battery. Further, a charge level of the vehicle battery exceeds 79% of the energy capacity of the vehicle battery at a start of usage event $U_5$, the first usage event in the second subgroup. Therefore, the second subgroup of usage events as a whole satisfies the qualification metrics, and thus is qualified as usage data for assessing health of the vehicle battery.

Further still in the first implementation, usage event $U_7$ would not be qualifiable individually, since a net amount of energy discharged from the vehicle battery during usage event $U_6$ is approximately 8%, which does not exceed 20% of the energy capacity of the vehicle battery. Additionally, in the example there are no other usage events which occur between charge events $C_3$ and $C_4$, such that no other usage events are grouped in a subgroup with usage event $U_7$. Therefore, the third subgroup of usage events (usage event $U_7$ alone) does not satisfy the qualification metrics, and thus is not qualified as usage data for assessing health of the vehicle battery.

Further still in the first implementation, neither of usage events $U_8$ or $U_9$ would be qualifiable individually, since a net amount of energy discharged from the vehicle battery during usage event $U_8$ is approximately 16%, which does not exceed 20% of the energy capacity of the vehicle battery, and since a charge level of the vehicle battery does not exceed 79% of the energy capacity of the vehicle battery at a start of usage event $U_9$. However, when considered as the fourth subgroup of usage events $U_8$ and $U_9$, a net amount of energy discharged from the vehicle battery is about 51% of the energy capacity of the vehicle battery, which exceeds 20% of the energy capacity of the vehicle battery. Further, a charge level of the vehicle battery exceeds 79% of the energy capacity of the vehicle battery at a start of usage event $U_8$, the first usage event in the fourth subgroup. Therefore, the fourth subgroup of usage events as a whole satisfies the qualification metrics, and thus is qualified as usage data for assessing health of the vehicle battery.

Further still in the first implementation, usage event $U_{10}$ would not be qualifiable individually. Even though a net amount of energy discharged from the vehicle battery during usage event $U_{10}$ is approximately 25%, which exceeds 20% of the energy capacity of the vehicle battery, a charge level of the vehicle battery does not exceed 79% of the energy capacity of the vehicle battery at a start of usage event $U_{10}$. Further, there are no other usage events which occur between charge events $C_5$ and $C_6$, such that no other usage events are grouped in a subgroup with usage event $U_{10}$. Therefore, the fifth subgroup of usage events (usage event $U_{10}$ alone) does not satisfy the qualification metrics, and thus is not qualified as usage data for assessing health of the vehicle battery.

Further still in the first implementation, none of usage events $U_{11}$ or $U_{12}$ would be qualifiable individually, since none of these usage events involve a net amount of energy discharged from the vehicle battery which exceeds 20% of the energy capacity of the vehicle battery. Further, a charge level of the vehicle battery does not exceed 79% of the energy capacity of the vehicle battery at a start of usage event $U_{12}$. Further, when considered as the sixth subgroup of usage events Un and Un, a net amount of energy discharged from the vehicle battery is about 15% of the energy capacity of the vehicle battery, which does not exceed 20% of the energy capacity of the vehicle battery. Therefore, the sixth subgroup of usage events as a whole does not satisfy the qualification metrics, and thus is not qualified as usage data for assessing health of the vehicle battery.

When considered individually, only usage event $U_5$ satisfies the qualification metrics used in the discussed example. However, as is evident from the above discussion, when usage events are considered together in subgroups, many more of the usage events become qualified (within a respective subgroup) as usage data for assessing the health of the vehicle battery. This provides a greater amount of available usage data for determining battery health.

As mentioned above, alternative implementations for grouping usage events into a subgroup are possible.

In a second exemplary implementation, identifying each subgroup of usage events comprises identifying each subgroup of usage events as a respective group of usage events within a respective time period. With reference to the example of FIG. 10, exemplary points in time $T_0$, $T_1$, $T_2$, $T_3$, and $T_4$ are illustrated. Usage events $U_1$, $U_2$, $U_3$, and $U_4$ are grouped as a first subgroup, because these usage events occur between time $T_0$ and time $T_1$; usage events $U_5$, $U_6$, $U_7$, and $U_8$ are grouped as a second subgroup, because these usage events occur between time $T_1$ and time $T_2$; usage events $U_9$ and $U_{10}$ are grouped as a third subgroup, because these usage events occur between time $T_2$ and time $T_3$; and usage events Un and $U_{12}$ are grouped as a fourth subgroup, because these usage events occur between time $T_3$ and time $T_4$. The time periods defined by times $T_0$, $T_1$, $T_2$, $T_3$, and $T_4$ are approximately equal in length, but this is not necessarily the case. In some cases, time periods could be set based on start or end points of usage events. As one example, usage events could be grouped into subgroups based on whether usage events are within a time period of a start time or end time of a first usage event (or last usage event), based upon which a subgroup is identified.

The qualification metrics discussed above with reference to the first implementation are also assumed for the discussion of the second implementation, but any qualification metric or plurality of qualification metrics could be used, as appropriate for a given application.

In the second implementation, the first subgroup of usage events $U_1$, $U_2$, $U_3$, or $U_4$ is the same as the first subgroup of usage events discussed with reference to the first implementation, and thus the same discussion applies to the second implementation. The discussion is not repeated for brevity, but as summarized above, the first subgroup of usage events as a whole satisfies the qualification metrics, and thus is qualified as usage data for assessing health of the vehicle battery.

Further in the second implementation, in the second subgroup of usage events $U_5$, $U_6$, $U_7$, and $U_8$, only usage event $U_5$ would individually satisfy the qualification metrics, whereas usage events $U_6$, $U_7$, and $U_8$ would not individually satisfy the qualification metrics, for the reasons discussed above with reference to first implementation. However, when considered as the second subgroup of usage events $U_5$, $U_6$, $U_7$, and $U_8$, a net amount of energy discharged from the vehicle battery is about 73% of the energy capacity of the vehicle battery, which exceeds 20% of the energy capacity of the vehicle battery. Further, a charge level of the vehicle battery exceeds 79% of the energy capacity of the vehicle battery at a start of usage event $U_5$, the first usage event in the second subgroup. Therefore, the second subgroup of usage events as a whole satisfies the qualification metrics, and thus is qualified as usage data for assessing health of the vehicle battery.

Further still in the second implementation, in the third subgroup of usage events $U_9$ and $U_{10}$, usage events $U_9$ and $U_{10}$ would not individually satisfy the qualification metrics, for the reasons discussed above with reference to first implementation. Considered together, the third subgroup of usage events $U_9$ and $U_{10}$ also would not satisfy the qualification metrics, since a charge level of the vehicle battery does not exceeds 79% of the energy capacity of the vehicle battery at a start of usage event $U_9$ or usage event $U_{10}$. Therefore the third subgroup of usage events $U_9$ and $U_{10}$ is not qualified as usage data for assessing health of the vehicle battery.

Further still in the second implementation, the fourth subgroup of usage events $U_{11}$ and $U_{12}$ is the same as the sixth subgroup of usage events discussed with reference to the first implementation, and thus the same discussion applies to the second implementation. The discussion is not repeated for brevity, but as summarized above, the fourth subgroup of usage events $U_{11}$ and $U_{12}$ does not satisfy the qualification metrics, and thus is not qualified as usage data for assessing health of the vehicle battery.

Similarly to as discussed above regarding the first implementation, when considered individually, only usage event $U_5$ satisfies the qualification metrics used in the discussed example, whereas when usage events are considered together in subgroups, many more of the usage events become qualified (within a respective subgroup) as usage data for assessing the health of the vehicle battery.

In a third exemplary implementation, identifying each subgroup of usage events comprises identifying each subgroup of usage events as a respective group of a set number of sequential usage events. For example, usage events could be grouped into subgroups of three sequential usage events each (i.e., the set number is three). The example where the set number of usage events is three is merely exemplary, and subgroups of usage events could be grouped based on any appropriate number of usage events. With reference to the example of FIG. 10, and grouping three sequential usage events per subgroup, usage events $U_1$, $U_2$, and $U_3$ are grouped as a first subgroup; usage events $U_4$, $U_5$, and $U_6$ are grouped as a second subgroup; usage events $U_7$, $U_8$, and $U_9$ are grouped as a third subgroup; and usage events $U_{10}$, $U_{11}$, and $U_{12}$ are grouped as a fourth subgroup.

The third exemplary implementation incorporates several usage events into qualifiable subgroups, where many of said usage events would not be individually qualifiable. This is discussed assuming a pair of qualification metrics which require that: a net amount of energy discharged from the vehicle battery over all of the usage events in a subgroup exceeds 20% of the energy capacity of the vehicle battery; and charge level of the vehicle battery exceeds 79% of the energy capacity of the vehicle battery at a start of at least one usage event in the subgroup. These metrics are discussed in more detail earlier. Further, use of these particular metrics is merely exemplary, and any metric or plurality of metrics could be utilized as appropriate for a given application. Notably, this pair of metrics is more specifically defined than the pair of metrics discussed with reference to the first and second implementations above. In particular, for the third implementation one metric is that charge level of the vehicle battery exceeds 79% of the energy capacity of the vehicle battery at a start of AT LEAST ONE (any one) usage event in the subgroup, whereas a similar metric for the first and second implementation is that charge level of the vehicle battery exceeds 79% of the energy capacity of the vehicle battery at a start of the usage events in the subgroup (which when interpreted strictly refers to the first usage event in the subgroup; though in some implementations could instead refer to at least one usage event in the subgroup). The consequences of this are discussed below.

In the third implementation, none of usage events $U_1$, $U_2$, or $U_3$ would be qualifiable individually, since none of these usage events involve a net amount of energy discharged from the vehicle battery which exceeds 20% of the energy capacity of the vehicle battery. Further, neither of usage events $U_2$ or $U_3$ would be qualifiable individually, since neither of these usage events involve a charge level of the vehicle battery exceeding 79% of the energy capacity of the vehicle battery at a start of the usage event. However, when considered as the first subgroup of usage events $U_1$, $U_2$, and $U_3$ a net amount of energy discharged from the vehicle battery is about 27% of the energy capacity of the vehicle battery, which exceeds 20% of the energy capacity of the vehicle battery. Further, a charge level of the vehicle battery exceeds 79% of the energy capacity of the vehicle battery at a start of usage event $U_1$, the first usage event in the first subgroup. Therefore, the first subgroup of usage events as a whole satisfies the qualification metrics, and thus is qualified as usage data for assessing health of the vehicle battery.

Further in the third implementation, usage event $U_5$ is individually qualifiable, since a net amount of energy discharged from the vehicle battery during usage event $U_5$ is approximately 47%, which exceeds 20% of the energy capacity of the vehicle battery, and a charge level of the vehicle battery exceeds 79% of the energy capacity of the vehicle battery at a start of usage event $U_5$. However, neither usage event $U_4$ nor usage event $U_6$ would not be qualifiable individually, since a net amount of energy discharged from the vehicle battery during usage events $U_4$ and $U_6$ is approximately 3% each, which does not exceed 20% of the energy capacity of the vehicle battery. Further, a charge level of the vehicle battery does not exceed 79% of the energy capacity of the vehicle battery prior to usage event $U_4$ or $U_6$. When considered as the second subgroup of usage events $U_4$, $U_5$, and $U_6$, a net amount of energy discharged from the vehicle battery is about 53% of the energy capacity of the vehicle battery, which exceeds 20% of the energy capacity of the vehicle battery. Although a charge level of the vehicle battery does not exceed 79% of the energy capacity of the vehicle battery at a start of usage event $U_4$ or usage event $U_6$, a charge level of the vehicle battery does exceed 79% of the energy capacity of the vehicle battery at a start of usage event $U_5$ (one of the usage events in the second subgroup). Therefore, the second subgroup of usage events as a whole satisfies the qualification metrics, and thus is qualified as usage data for assessing health of the vehicle battery.

Further still in the third implementation, none of usage events $U_7$, $U_8$, or $U_9$ would be qualifiable individually, since a net amount of energy discharged from the vehicle battery during usage event $U_7$ is approximately 8%, which does not exceed 20% of the energy capacity of the vehicle battery; a net amount of energy discharged from the vehicle battery during usage event $U_8$ is approximately 16%, which does not exceed 20% of the energy capacity of the vehicle battery; and a charge level of the vehicle battery does not exceed 79% of the energy capacity of the vehicle battery at a start of usage event $U_9$. However, when considered as the third subgroup of usage events $U_7$, $U_8$, and $U_9$, a net amount of energy discharged from the vehicle battery is about 59% of the energy capacity of the vehicle battery, which exceeds 20% of the energy capacity of the vehicle battery. Further, a charge level of the vehicle battery exceeds 79% of the energy capacity of the vehicle battery at a respective start of usage events $U_7$ and $U_8$. Therefore, the third subgroup of usage events as a whole satisfies the qualification metrics, and thus is qualified as usage data for assessing health of the vehicle battery.

Further still in the third implementation, usage event $U_{10}$ would not be qualifiable individually. Even though a net amount of energy discharged from the vehicle battery during usage event $U_{10}$ is approximately 30%, which exceeds 20% of the energy capacity of the vehicle battery, a charge level of the vehicle battery does not exceeds 79% of the energy capacity of the vehicle battery at a start of usage event $U_{10}$. Further, neither of usage events $U_{11}$ or $U_{12}$ would be qualifiable individually, since neither of these usage events involve a net amount of energy discharged from the vehicle battery which exceeds 20% of the energy capacity of the vehicle battery. Further, a charge level of the vehicle battery does not exceed 79% of the energy capacity of the vehicle battery at a start of usage event $U_{12}$. However, when considered as the fourth subgroup of usage events $U_{10}$, $U_{11}$, and $U_{12}$, a net amount of energy discharged from the vehicle battery is about 45% of the energy capacity of the vehicle battery, which exceeds 20% of the energy capacity of the vehicle battery. Further, a charge level of the vehicle battery exceeds 79% of the energy capacity of the vehicle battery at a start of usage event Un (one of the usage events in the fourth subgroup). Therefore, the fourth subgroup of usage events as a whole satisfies the qualification metrics, and thus is qualified as usage data for assessing health of the vehicle battery.

When considered individually, only usage event $U_5$ satisfies the qualification metrics used in the discussed example. However, as is evident from the above discussion, when usage events are considered together in subgroups, many more of the usage events become qualified (within a respective subgroup) as usage data for assessing the health of the vehicle battery. In the third implementation, all of the usage data ends up being qualified as part of respective subgroups.

In an exemplary fourth implementation, identification of at least one subgroup of at least one usage event can be performed concurrently with (or based on) qualification of usage events and/or at least one subgroup of at least one usage event. In this fourth implementation, the subset of the plurality of usage events in act 804 of method 800 in FIG. 8 includes at least one subgroup of usage events, where a net amount of energy discharged from the vehicle battery over all of the usage events in a subgroup of the at least one subgroup of usage events exceeds a select proportion of the energy capacity of the vehicle battery; and the method 800 further comprises: where a net amount of energy discharged from the vehicle battery over a first usage event is less than the select proportion of the energy capacity of the vehicle battery, group the first usage event with at least one sequential usage event as a subgroup of usage events in the at least one subgroup of usage events. That is, if a net amount of energy discharged from the vehicle battery over a first usage event does not meet a qualification metric, a sequential usage event is grouped together with the first usage event as a subgroup, for qualification. This can be repeated as needed, until a subgroup of usage events satisfies qualification metrics. For example, the first usage event can be grouped in a subgroup of usage events with a second usage event sequential with the first usage event, as discussed above. If a net amount of energy discharged from the vehicle battery over the subgroup of usage events (the first usage event and the second usage event) is less than the select proportion of the energy capacity of the vehicle battery, a third usage event sequential with one of the first usage event or the second usage event can be grouped in the subgroup of usage events. Such a process can be repeated as many times as needed until either the subgroup satisfied qualification metrics, or until a limit is reached and the subgroup is determined as not being qualified. Such a limit could comprise, as non-limiting examples, a limit on an acceptable number of usage events in a subgroup, or a limit on a time period within which usage events occur.

A practical application of the fourth implementation is discussed below with reference to the example charge plot 1000 in FIG. 10. Usage events are analyzed in reverse chronological order in this discussion, but usage events could also be analyzed in chronological order as appropriate for a given application. The fourth implementation is discussed assuming a pair of qualification metrics which are: a net amount of energy discharged from the vehicle battery over all of the usage events in a subgroup exceeds 20% of the energy capacity of the vehicle battery; and charge level of the vehicle battery exceeds 79% of the energy capacity of the vehicle battery at a start of A FIRST (chronologically) usage event in the subgroup. These metrics are discussed in more detail earlier. Further, use of these particular qualification metrics is merely exemplary, and any metric or plurality of metrics could be utilized as appropriate for a given application.

Usage event $U_{12}$ is not qualifiable individually, since a net amount of energy discharged from the vehicle battery during usage event $U_{12}$ is approximately 10%, which does not exceed 20% of the energy capacity of the vehicle battery. As such, usage event $U_{12}$ is grouped in a subgroup with usage event $U_{11}$. When considered as a subgroup, usage events $U_{11}$ and $U_{12}$ are still not qualifiable, since a net amount of energy discharged from the vehicle battery during usage events $U_{11}$ and $U_{12}$ is approximately 15%, which does not exceed 20% of the energy capacity of the vehicle battery. As such, the subgroup of usage events $U_{11}$ and $U_{12}$ is expanded to further include usage event $U_{10}$. A net amount of energy discharged from the vehicle battery during usage events $U_{10}$, $U_{11}$, and $U_{12}$ is approximately 45%, which exceeds 20% of the energy capacity of the vehicle battery. If this were the only qualification metric, then the subgroup of usage events $U_{10}$, $U_{11}$, and $U_{12}$ would be qualified. However, in the illustrative example there is an additional metric where charge level of the vehicle battery exceeds a 79% of the energy capacity of the vehicle battery prior to the first chronological usage event in the subgroup, which is not satisfied by usage event $U_{10}$. Consequently, the subgroup is further expanded to include an additional usage event $U_9$. However, charge level of the vehicle battery does not exceed 79% of the energy capacity of the vehicle battery prior to usage event $U_9$ (the new chronological first usage event). Consequently, the subgroup is further expanded to include an additional usage event $U_8$. Charge level of the vehicle battery does exceed 79% of the energy capacity of the vehicle battery at a start of usage event $U_8$, and thus charge level of the vehicle battery does exceed 79% of the energy capacity of the vehicle battery at a start of the first chronological usage event in the subgroup. Further, a net amount of energy discharged from the vehicle battery during usage events $U_8$, $U_9$, $U_{10}$, $U_{11}$, and $U_{12}$ is approximately 91%, which exceeds 20% of the energy capacity of the vehicle battery. Thus, the subgroup of usage events $U_8$, $U_9$, $U_{10}$, $U_{11}$, and $U_{12}$ satisfies the qualification metrics, and therefore is qualified as usage data for assessing health of the vehicle battery.

In the fourth implementation, a plurality of subgroups can be identified and qualified in a similar manner to as discussed above. Continuing the analysis with usage event $U_7$ (which chronologically precedes usage event $U_8$): usage event $U_7$ is not qualifiable individually, since a net amount of energy discharged from the vehicle battery during usage event $U_7$ is approximately 8%, which does not exceed 20% of the energy capacity of the vehicle battery. As such, usage event $U_7$ is grouped in a subgroup with usage event $U_6$. When considered as a subgroup, usage events $U_6$ and $U_7$ are still not qualifiable, since a net amount of energy discharged from the vehicle battery during usage events $U_6$ and $U_7$ is approximately 11%, which does not exceed 20% of the energy capacity of the vehicle battery. As such, the subgroup of usage events $U_6$ and $U_7$ is expanded to further include usage event $U_5$. A net amount of energy discharged from the vehicle battery during usage events $U_5$, $U_6$, and $U_7$ is approximately 58%, which exceeds 20% of the energy capacity of the vehicle battery. Further, charge level of the vehicle battery does exceed 79% of the energy capacity of the vehicle battery at a start of usage event $U_5$ (the first chronological usage event in the subgroup). Thus, the subgroup of usage events $U_5$, $U_6$, and $U_7$ satisfies the qualification metrics, and therefore is qualified as usage data for assessing health of the vehicle battery.

Continuing the analysis with usage event $U_4$ (which chronologically precedes usage event $U_5$): usage event $U_4$ is not qualifiable individually, since a net amount of energy discharged from the vehicle battery during usage event $U_4$ is approximately 3%, which does not exceed 20% of the energy capacity of the vehicle battery. As such, usage event $U_4$ is grouped in a subgroup with usage event $U_3$. When considered as a subgroup, usage events $U_3$ and $U_4$ are still not qualifiable, since a net amount of energy discharged from the vehicle battery during usage events $U_3$ and $U_4$ is approximately 12%, which does not exceed 20% of the energy capacity of the vehicle battery. As such, the subgroup of usage events $U_3$ and $U_4$ is expanded to further include usage event $U_2$. When considered as a subgroup, usage events $U_2$, $U_3$, and $U_4$ are still not qualifiable, since a net amount of energy discharged from the vehicle battery during usage events $U_2$, $U_3$, and $U_4$ is approximately 19%, which does not exceed 20% of the energy capacity of the vehicle battery. As such, the subgroup of usage events $U_2$, $U_3$, and $U_4$ is expanded to further include usage event $U_1$. A net amount of energy discharged from the vehicle battery during usage events $U_1$, $U_2$, $U_3$, and $U_4$ is approximately 30%, which exceeds 20% of the energy capacity of the vehicle battery. Further, charge level of the vehicle battery exceeds 79% of the energy capacity of the vehicle battery at a start of usage event $U_1$, and thus charge level of the vehicle battery does exceed 79% of the energy capacity of the vehicle battery at a start of the first chronological usage event in the subgroup. Thus, the subgroup of usage events $U_1$, $U_2$, $U_3$, and $U_4$ satisfies the qualification metrics, and therefore is qualified as usage data for assessing health of the vehicle battery.

In the fourth implementation, additional constraints or metrics could be implemented which limit inclusion of certain usage events in a subgroup. For example, a time period threshold could be set, where usage events must occur within the time period threshold in order to be included together in a subgroup. As one illustrative case, such a time period threshold could prevent usage event $U_{10}$ from being included in a subgroup with usage events $U_{11}$ and $U_{12}$, since these usage events occur relatively far from each other in time. As another exemplary limitation, a threshold could be set on a number of usage events in a subgroup. As one illustrative case, subgroups could be limited to including three usage events. In the fourth implementation discussed above, such a limitation would prevent usage events $U_8$ and $U_9$ from being included in a subgroup with usage events $U_{10}$, $U_{11}$ and $U_{12}$. The purpose for such limitations is to avoid qualifying usage data which is too disparate, and could introduce inaccuracy into battery health estimation.

In addition to (or alternative to) identifying qualified usage events or subgroups of usage events, determining battery health can be limited to only a subset of recent usage events. For example, determining an average energy to discharge the battery by one-charge level as in act 804 discussed above can be limited to averaging usage data from a recent subset of usage events (e.g. the most recent 6, 10, or 15 usage events or subgroups of usage events, and/or only usage events within the last 90, 120, or 180 days) though other numbers of usage events are also possible. Similarly, determining battery health can be limited to only a subset of recent qualified usage events or subgroups of usage events. For example, determining an average energy to discharge the battery by one charge level as in act 804 discussed above can be limited to averaging usage data from a recent subset of qualified usage events or qualified subgroups of usage events (e.g. the most recent 6, 10, or 15 qualified usage events or qualified subgroups of usage events, and/or only qualified usage events or qualified subgroups of usage events within the last 90, 120, or 180 days, though other numbers of qualified usage events are also possible). Determination of whether usage events or subgroups of usage events are qualified or not can be performed before or after a subset of usage events of interest are identified based on how recent the usage events are. For example, from a plurality of usage events, a first subset of usage events can be identified which includes only recent usage events (e.g. the most recent 10 to 30 usage events), then a second subset of usage events or subgroups of usage events within the first subset can be identified by comparing the usage events in the first subset to grouping or qualification metrics as discussed above. As an alternative example, from a plurality of usage events, a first subset of qualified usage events or subgroups of usage events can be identified by comparing the usage events in the plurality of usage events to qualification or grouping metrics as discussed above, and from the first subset of qualified usage events or subgroups of usage events, a second subset of qualified usage events or subgroup of usage events within the first subset can be identified based on which usage events in the first subset are recent usage events (e.g. the most recent 10 to 30 qualified usage events or subgroups of usage events, and/or only usage events within the last 90, 120, or 180 days). In yet another alternative example, a threshold for recent usage events could be set as a qualification metric (recentness metric), and each usage event could be compared to this recentness metric alongside comparisons to other metrics during the grouping or qualification process.

FIGS. 5 and 6 and the corresponding discussion are directed to determining state of health of a vehicle battery based on charge data from charge events. FIGS. 8, 9, and 10 and the corresponding discussion are directed to determining state of health of a vehicle battery based on usage data from usage events. In some implementations, state of health of a vehicle battery could be determined based on both charge data and usage data. In one example, a first determination of state of health could be obtained via method 500 in FIG. 5, and a second determination of state of health could be obtained by method 800 in FIG. 8. The first determination and the second determination could be compared, unified, or otherwise combined to arrive at a final determination of state of health. For example, the first determination of state of health and the second determination of state of health could be averaged. Further, such combination of the first and second determinations of health could be weighted based on expected accuracy of determination of state of health based on charge data versus usage data. That is, the more accurate of method 500 or method 800 could be weighted higher in a combined determination of battery state of health. Which method is more accurate is dependent at least on available data.

Figure 11:
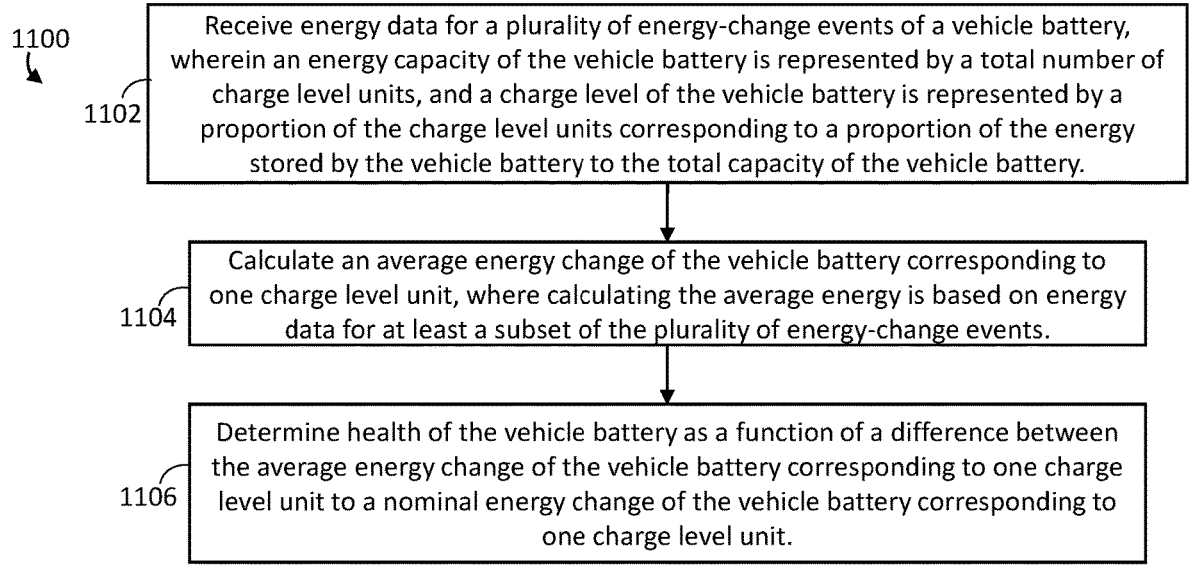
FIGS. 11 and 12 are flowchart diagrams which illustrate exemplary methods for determining battery health based on energy data for energy-change events.

FIG. 11 is a flowchart diagram which illustrates a method 1100 for evaluating battery health. Method 1100 as illustrated includes acts 1102, 1104, and 1106, though acts could be removed, acts could be added, or acts could be reordered, as appropriate for a given application. Method 1100 is similar to method 500 discussed with reference to FIG. 5 and method 800 discussed with reference to FIG. 8. Method 1100 aims to determine health of a vehicle battery based on energy data representing change in charge level of the battery (increase or decrease in charge level, such as by charging or by discharging or usage). That is, method 1100 is inclusive of determining battery state of health based on one or both of charge data and usage data.

In act 1102, energy data for a plurality of energy-change events of a vehicle battery is received. For example, any appropriate sensors, such as any of sensors 119, 209, or 439, can monitor energy transfer and collect data thereon. Any of at least one processor 116, 206, 326, or 436 can prepare, process, or format collected energy data. In this context, an "energy-change event" refers to a period of time where an amount of energy stored in the vehicle battery changes. An energy-change event can include a charge event as discussed earlier, or can include a usage event as discussed earlier. At least one processor preparing, formatting, or processing energy data can include parsing energy data into data for energy-change events. Collection of charge data and collection of usage data as described herein is also applicable to collection of energy data.

Any of sensors 119, 209, or 439, can monitor energy transferred from the vehicle battery and energy transferred to the vehicle battery during energy-change events, and provide resulting energy data to at least one processor based on the monitored energy transfer. For example, sensor 209 can be configured to monitor energy transferred from the vehicle battery to power a vehicle. As another example, any of sensors 119, 209, or 439, can be configured to monitor energy input to the vehicle battery from a charging station, a regenerative braking system of a vehicle, or solar panels of a vehicle.

Similar to as discussed above with reference to FIGS. 5 and 8, energy capacity of the battery is represented by a total number of charge level units. A charge level of the battery is represented by a proportion of the charge level units corresponding to a proportion of the energy stored by the battery to the total capacity of the battery. The discussion of FIG. 5 regarding how energy capacity of the battery is represented is fully applicable to the implementation of FIG. 11 as well, and is not repeated for brevity.

In act 1104, an average energy of the vehicle battery corresponding to one charge level unit is calculated (e.g. by any of at least one processor 116, 206, 326, or 436). Such a calculation is based on at least a subset of a plurality of energy-change events represented in the energy data (e.g., certain energy-change events can be excluded if they don't meet specified metrics, or certain energy-change events can be grouped together in at least one subgroup, to improve accuracy as discussed previously). In one example, for a given energy-change event (or subgroup of energy-change events), the total amount of energy received by or discharged from the battery, as well as a change in the charge level (i.e. the number of charge units changed during the energy-change event or subgroup of energy-change events) can be included in the energy data. Alternatively, a charge level at the start of the energy-change event or subgroup of energy-change events and a charge level at the end of the energy-change event or subgroup of energy-change events can be included in the energy data, from which the change in the charge level can be determined. For the energy-change event or subgroup of energy-change events, the total amount of energy received by or discharged from the battery can be divided by the numerical change in charge units, to determine the amount of energy per one charge level unit. This is shown in Formula (11) below:

$$\Delta EPU = \frac{E_N}{CL_e - CL_s} = \frac{E_N}{\Delta CL} \quad (11)$$

$\Delta EPU$ (Energy Change Per Unit) refers to the calculated energy received by or transferred from the battery which corresponds to a change of one charge level of the for the energy-change event or subgroup of energy-change events. $E_N$ refers to net energy received by or transferred from the battery during the energy-change event or subgroup of energy-change events. $CL_e$ refers to the charge level of the battery at the end of the energy-change event or subgroup of energy-change events. $CL_s$ refers to the charge level of the battery at the start of the energy-change event or subgroup of energy-change events. $\Delta CL$ refers to the difference in charge level between the start and the end of the energy-change event or subgroup of energy-change events. $\Delta EPU$ can be converted to or represented as an absolute value (always positive), even if $CL_s$ is greater than $Cl_e$.

The calculation of Formula (11) is performed for a plurality of energy-change events or a plurality of subgroups of energy-change events, to determine a plurality of amounts of energy per one charge level unit (plurality of $\Delta EPUs$). The plurality of amounts of energy per one charge level unit are averaged (each of the $\Delta EPUs$ is summed together, then divided by the number of $\Delta EPUs$). The result is an average energy change of the vehicle battery corresponding to one charge level unit. This is shown in Formula (12) below.

$$\overline{\Delta EPU} = \frac{1}{n}\sum\nolimits_{x=1}^{n} \Delta EPU_x \quad (12)$$

Where $\overline{\Delta EPU}$ refers to the calculated average energy change of the vehicle battery corresponding to one charge level unit for a set of n energy-change events or a set of n subgroups of energy-change events. $\Delta EPU_x$ refers to the energy change of the vehicle battery corresponding to one charge level in one energy-change event or one subgroup of energy-change events (denoted as energy-change event x or subgroup of energy change events x). Each $\overline{\Delta EPU_x}$ can be taken as an absolute value (always positive).

By determining average energy change of the vehicle battery corresponding to one charge unit, based on data from a plurality of energy-change events, energy fluctuation abnormalities can be averaged out.

In act 1106, health of the battery is determined (e.g. by any of at least one processor 116, 206, 326, or 436), as a function of a difference between the average energy change of the vehicle battery corresponding to one charge level unit to a nominal energy change of the vehicle battery corresponding to one charge level unit. Nominal energy change of the vehicle battery corresponding to one charge level unit represents the expected energy change of the vehicle battery corresponding to one charge level unit for a new or healthy battery. In some implementations, nominal energy change of the vehicle battery corresponding to one charge level unit can be provided by a manufacturer of the vehicle or manufacturer of the battery. In other implementations, nominal energy change of the vehicle battery corresponding to one charge level unit can be determined from information provided by a manufacturer of the vehicle or manufacturer of the battery. For example, a manufacturer could provide an optimal capacity of a provided battery, and the nominal energy change of the vehicle battery corresponding to one charge level unit can be determined by dividing the battery capacity by the number of charge level units. The number of charge level units can be provided by the manufacturer, or can be set as desired for a given system. In some implementations, optimal capacity of a vehicle battery can be determined, such as discussed in detail above with reference to FIG. 7. Generally, the greater the difference between energy change of the vehicle battery corresponding to one charge level unit and nominal energy change of the vehicle battery corresponding to one charge level unit, the less healthy the battery.

Figure 12:
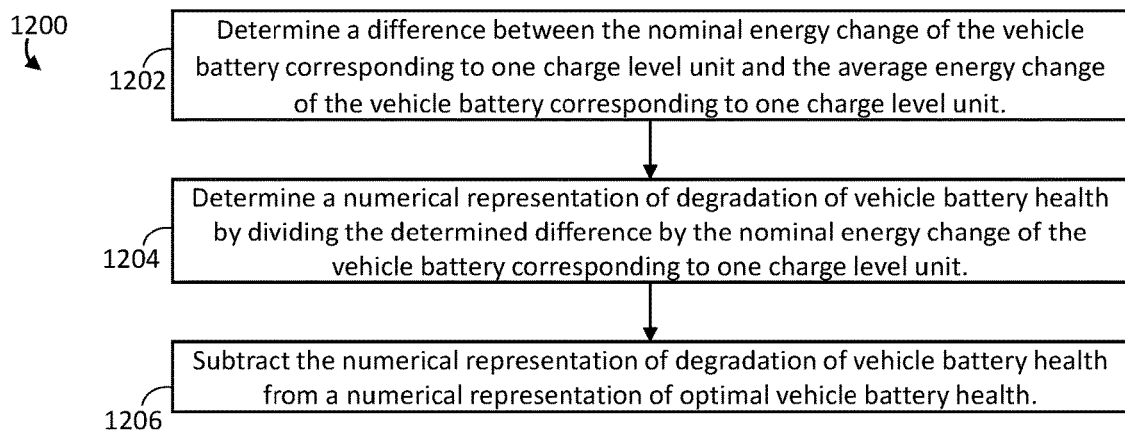

FIG. 12 is a flowchart diagram which illustrates a detailed example method 1200 for determining health of a battery as discussed regarding act 1206 above. That is, method 1200 is a detailed implementation of act 1206. Method 1200 as illustrated includes acts 1202, 1204, and 1206, though acts could be removed, acts could be added, or acts could be reordered, as appropriate for a given application.

In act 1202, a difference between the nominal energy change of the vehicle battery corresponding to one charge level unit and the average energy change of the vehicle battery corresponding to one charge level unit is determined (e.g. by any of at least one processor 116, 206, 326, or 436).

In act 1204, a numerical representation of degradation of battery health is determined (e.g. by any of at least one processor 116, 206, 326, or 436) by dividing the determined difference by the nominal energy change of the vehicle battery corresponding to one charge level unit.

In act 1206, the numerical representation of degradation of battery health is subtracted (e.g. by any of at least one processor 116, 206, 326, or 436) from a numerical representation of optimal battery health. The result is a numerical representation of present battery health.

Method 1200 can be summarized by Formula (13) below:

$$BH_P = BH_O - \frac{\Delta EPU_n - \Delta EPU_a}{\Delta EPU_n} \quad (13)$$

$BH_P$ is a numerical representation of the present health of the battery; $BH_O$ is a numerical representation of optimal health of the battery (e.g. a new battery); $\Delta EPU_n$ is the nominal energy change of the vehicle battery corresponding to one charge unit; $\Delta EPU_n$ is the calculated average energy change of the vehicle battery corresponding to one charge unit (as calculated in act 1104 or Formula (11) above). $BH_O$ can be set to 1, such that $BH_P$ will be some fraction of 1. By multiplying $BH_P$ by 100, present battery health as a percentage of optimal battery health can be determined.

To ensure $BH_P$ is a fraction of 1, Formula (14) below can be used:

$$BH_P = \max\left(0, \min\left(1, 1 - \frac{\Delta EPU_n - \Delta EPU_a}{\Delta EPU_n}\right)\right) \quad (14)$$

Formula (14) is similar to Formula (13), except that $BH_P$ is locked to be between 0 and 1. Multiplying $BH_P$ by 100 will result in $BH_P$ representing battery health as a percentage of optimal battery health.

Method 1100 in FIG. 11 and method 1200 in FIG. 12 can be performed by the hardware illustrated in any of FIGS. 1, 2, 3, and 4. In particular, in any of the systems specified with reference to FIGS. 1, 2, 3, and 4, the described at least one processor can act to performs acts of analysis, determination, identification, calculation, or similar. Any of the at least one non-transitory processor-readable storage mediums can have instructions stored thereon, which when executed by one of the at least one processor cause the system to perform the method 1100 or the method 1200. Any of the described sensors can perform acts of monitoring charging, collecting charge data, monitoring usage, and collecting usage data.

Generally, discussion of charge events and usage events is fully applicable to energy-change events unless context dictates otherwise. For example, discussion of identification of subgroups of usage events, qualification of events (charge events or usage events), and qualification metrics, are fully applicable to energy-change events unless context dictates otherwise.

While the present invention has been described with respect to the non-limiting embodiments, it is to be understood that the invention is not limited to the disclosed embodiments. Persons skilled in the art understand that the disclosed invention is intended to cover various modifications and equivalent arrangements included within the scope of the appended claims. Thus, the present invention should not be limited by any of the described embodiments.

Throughout this specification and the appended claims, infinitive verb forms are often used, such as "to operate" or "to couple". Unless context dictates otherwise, such infinitive verb forms are used in an open and inclusive manner, such as "to at least operate" or "to at least couple".

The specification includes various implementations in the form of block diagrams, schematics, and flowcharts. A person of skill in the art will appreciate that any function or operation within such block diagrams, schematics, and flowcharts can be implemented by a wide range of hardware, software, firmware, or combination thereof. As non-limiting examples, the various embodiments herein can be implemented in one or more of: application-specific integrated circuits (ASICs), standard integrated circuits (ICs), programmable logic devices (PLDs), field-programmable gate arrays (FPGAs), computer programs executed by any number of computers or processors, programs executed by one or more control units or processor units, firmware, or any combination thereof.

The disclosure includes descriptions of several processors. Said processor can be implemented as any hardware capable of processing data, such as application-specific integrated circuits (ASICs), standard integrated circuits (ICs), programmable logic devices (PLDs), field-programmable gate arrays (FPGAs), logic circuits, or any other appropriate hardware. The disclosure also includes descriptions of several non-transitory processor-readable storage mediums. Said non-transitory processor-readable storage mediums can be implemented as any hardware capable of storing data, such as magnetic drives, flash drives, RAM, or any other appropriate data storage hardware.

What is claimed is:

1. A system comprising:
   at least one processor;
   at least one non-transitory processor-readable storage medium having processor-executable instructions stored thereon which when executed cause the at least one processor to:
   process energy data for a plurality of energy-change events of a vehicle battery, wherein an energy capacity of the vehicle battery is represented by a total number of charge level units, and a charge level of the vehicle battery is represented by a proportion of the charge level units corresponding to a proportion of energy stored by the vehicle battery to energy capacity of the vehicle battery;
   identify at least one qualified subgroup of energy-change events in the plurality of energy-change events, each qualified subgroup of energy-change events including at least one energy-change event;
   calculate an average energy change of the vehicle battery corresponding to one charge level unit, where calculation of the average energy change is based on energy data for a subset of the plurality of energy-change events, wherein the subset of the plurality of energy-change events includes only qualified subgroups of energy-change events; and
   determine health of the vehicle battery as a function of a difference between the average energy change of the vehicle battery corresponding to one charge level unit to a nominal energy change of the vehicle battery corresponding to one charge level unit.

2. The system of claim 1, wherein the processor-executable instructions which cause the at least one processor to identify at least one qualified subgroup of energy-change events in the plurality of energy-change events cause the at least one processor to:
   identify at least one subgroup of energy usage events in the plurality of energy-change events; and
   qualify at least one subgroup of the at least one subgroup of energy usage events as a qualified subgroup of energy-change events.

3. The system of claim 2, wherein the processor-executable instructions which cause the at least one processor to identify at least one subgroup of energy usage events cause the at least one processor to: identify each subgroup of energy usage events as a respective group of energy usage events between sequential charge events of the vehicle battery.

4. The system of claim 2, wherein the processor-executable instructions which cause the at least one processor to identify at least one subgroup of energy usage events cause the at least one processor to: identify each subgroup of energy usage events as a respective group of energy usage events within a respective time period.

5. The system of claim 2, wherein the processor-executable instructions which cause the at least one processor to identify at least one subgroup of energy usage events cause the at least one processor to: identify each subgroup of energy usage events as a respective group of a set number of sequential usage events.

6. The system of claim 2, wherein the processor-executable instructions which cause the at least one processor to qualify at least one subgroup of the at least one subgroup of energy usage events cause the at least one processor to: for each subgroup of the at least one subgroup of energy usage events, qualify the subgroup if at least one metric is satisfied, the at least one metric selected from a group of metrics consisting of:
- a net amount of energy discharged from the vehicle battery over all of the energy usage events in the subgroup exceeds a select proportion of the energy capacity of the vehicle battery;
- charge level of the vehicle battery exceeds a threshold of the energy capacity of the vehicle battery at a start of at least one energy usage event in the subgroup; and
- each energy usage event in the subgroup is within a select time threshold.

7. The system of claim 2, wherein the processor-executable instructions which cause the at least one processor to qualify at least one subgroup cause the at least one processor to: for each subgroup of the at least one subgroup of usage events, qualify the subgroup if:
- a net amount of energy discharged from the vehicle battery over all of the usage events in the subgroup exceeds a select proportion of the energy capacity of the vehicle battery;
- charge level of the vehicle battery exceeds a threshold of the energy capacity of the vehicle battery at a start of at least one usage event in the subgroup; and
- each usage event in the subgroup is within a select time threshold.

8. The system of claim 1, wherein the processor-executable instructions which cause the at least one processor to identify at least one qualified subgroup of energy-change events in the plurality of energy-change events cause the at least one processor to:
- identify a first energy usage event of the plurality of energy-change events, where a net amount of energy discharged from the vehicle battery over the first energy usage event is less than a select proportion of the energy capacity of the vehicle battery required for the first energy usage event alone to qualify as a qualified subgroup of at least one energy-change event; and
- group the first energy usage event with at least one sequential energy usage event as a first subgroup of energy-change events in the at least one subgroup of energy-change events, where a net amount of energy discharged from the vehicle battery over the first subgroup of energy-change events is more than the select proportion of the energy capacity of the vehicle battery required for the first subgroup of energy change-events to qualify as a qualified subgroup of at least one energy-change event.

9. The system of claim 1, wherein the processor-executable instructions which cause the at least one processor to identify at least one qualified subgroup of energy-change events in the plurality of energy-change events cause the at least one processor to: identify at least one subgroup of the at least one subgroups as a qualified subgroup which includes a respective one charge event of the vehicle battery, where the one charge event satisfies at least one metric selected from a group consisting of:
- an amount of energy transferred to the vehicle battery in the one charge event exceeds a select proportion of the energy capacity of the vehicle battery;
- charge level of the vehicle battery exceeds a threshold of the energy capacity of the vehicle battery at an end of the one charge event;
- a rate of energy transfer to the vehicle battery during the one charge event exceeds an energy transfer rate threshold; and
- a duration of the one charge event is within a time threshold.

10. The system of claim 1, wherein the processor-executable instructions which cause the at least one processor to identify at least one qualified subgroup of energy-change events in the plurality of energy-change events cause the at least one processor to: identify at least one subgroup as a qualified subgroup which includes a respective one charge event of the vehicle battery, where:
- an amount of energy transferred to the vehicle battery in the one charge event exceeds a select proportion of the energy capacity of the vehicle battery;
- charge level of the vehicle battery exceeds a threshold of the energy capacity of the vehicle battery at an end of the one charge event;
- a rate of energy transfer to the vehicle battery during the one charge event exceeds an energy transfer rate threshold; and
- a duration of the one charge event is within a time threshold.

11. The system of claim 1, wherein the at least one qualified subgroup of energy-change events includes only six most recent qualified subgroups of usage events.

12. The system of claim 1, wherein the processor-executable instructions which cause the at least one processor to determine health of the vehicle battery cause the at least one processor to:
- determine a difference between the nominal energy change of the vehicle battery corresponding to one charge level unit and the average energy change of the vehicle battery corresponding to one charge level unit;
- determine a numerical representation of degradation of vehicle battery health by dividing the determined difference by the nominal energy change of the vehicle battery corresponding to one charge level unit; and
- subtract the numerical representation of degradation of vehicle battery health from a numerical representation of optimal vehicle battery health.

13. The system of claim 1, wherein the processor-executable instructions further cause the at least one processor to determine the nominal energy change of the vehicle battery corresponding to one charge level unit by dividing an optimal value for energy capacity of the vehicle battery by the total number of charge level units.

14. The system of claim 1, further comprising the vehicle battery, wherein the at least one processor, the at least one non-transitory processor-readable storage medium, and the vehicle battery are included in a vehicle.

15. The system of claim 1, wherein the at least one processor and the at least one non-transitory processor-readable storage medium are included in a computing device remote from a vehicle which includes the vehicle battery.

16. The system of claim 1, further comprising at least one sensor to monitor energy transferred from the vehicle battery and energy transferred to the vehicle battery during energy-change events, and provide the energy data to the at least one processor based on monitored energy transfer.

17. The system of claim 16, wherein the processor-executable instructions further cause the at least one sensor to monitor energy transferred from the vehicle battery by monitoring energy which is output by the vehicle battery to power the vehicle.

18. The system of claim 16, wherein the processor-executable instructions further cause the at least one sensor to monitor energy transferred to the vehicle battery by monitoring energy which is input to the vehicle battery from a regenerative braking system of the vehicle.

19. The system of claim 1, wherein the processor-executable instructions further cause the system to output the determined health of the vehicle battery for review by a user.

\* \* \* \* \*